(12) United States Patent
Achi

(10) Patent No.: US 11,757,063 B2
(45) Date of Patent: Sep. 12, 2023

(54) METHOD FOR MANUFACTURING LINEAR LIGHT SOURCE

(71) Applicant: NICHIA CORPORATION, Anan (JP)

(72) Inventor: Yusaku Achi, Tokushima (JP)

(73) Assignee: NICHIA CORPORATION, Anan (JP)

( * ) Notice: Subject to any disclaimer, the term of this patent is extended or adjusted under 35 U.S.C. 154(b) by 269 days.

(21) Appl. No.: 17/129,308

(22) Filed: Dec. 21, 2020

(65) Prior Publication Data
US 2021/0202792 A1 Jul. 1, 2021

(30) Foreign Application Priority Data

Dec. 27, 2019 (JP) .................................. 2019-237949

(51) Int. Cl.
*H01L 33/00* (2010.01)

(52) U.S. Cl.
CPC .. *H01L 33/0095* (2013.01); *H01L 2933/0041* (2013.01); *H01L 2933/0058* (2013.01); *H01L 2933/0066* (2013.01)

(58) Field of Classification Search
CPC .............................................. H01L 2933/0058
USPC .......................................................... 438/29
See application file for complete search history.

(56) References Cited

U.S. PATENT DOCUMENTS

| 9,899,359 B1 | 2/2018 | Cheng et al. |
| 2007/0274096 A1 | 11/2007 | Chew et al. |
| 2011/0122650 A1 | 5/2011 | Osumi et al. |
| 2015/0034987 A1* | 2/2015 | Hayashi ................. H01L 33/50 438/27 |
| 2015/0303356 A1 | 10/2015 | Sanga et al. |
| 2017/0090101 A1 | 3/2017 | Hayashi |
| 2019/0058095 A1 | 2/2019 | Choi et al. |

FOREIGN PATENT DOCUMENTS

| JP | 2003279971 A | 10/2003 |
| JP | 2007317659 A | 12/2007 |
| JP | 2011113752 A | 6/2011 |
| JP | 2015207615 A | 11/2015 |
| JP | 2017069049 A | 4/2017 |
| JP | 2019036713 A | 3/2019 |
| WO | 2017163608 A1 | 9/2017 |

* cited by examiner

*Primary Examiner* — Hsin Yi Hsieh
(74) *Attorney, Agent, or Firm* — Global IP Counselors, LLP

(57) ABSTRACT

A method for manufacturing a linear light source includes: providing a base having a first surface defining recesses in an array in a first direction, and a second surface having a curved contour in a cross section orthogonal to the first direction and a straight contour in a cross section parallel to the first direction; providing light sources each having a top surface and a bottom surface including electrodes; placing the light sources at positions overlapping the recesses in a plan view with the top surface of the light source facing a bottom surface of the recess; placing a first reflective member to cover the light sources and the first surface so that the electrodes of the light sources are exposed; placing a second reflective member on the second surface; and cutting the base along the first direction to define a third surface continuous with the first and second surfaces.

14 Claims, 28 Drawing Sheets

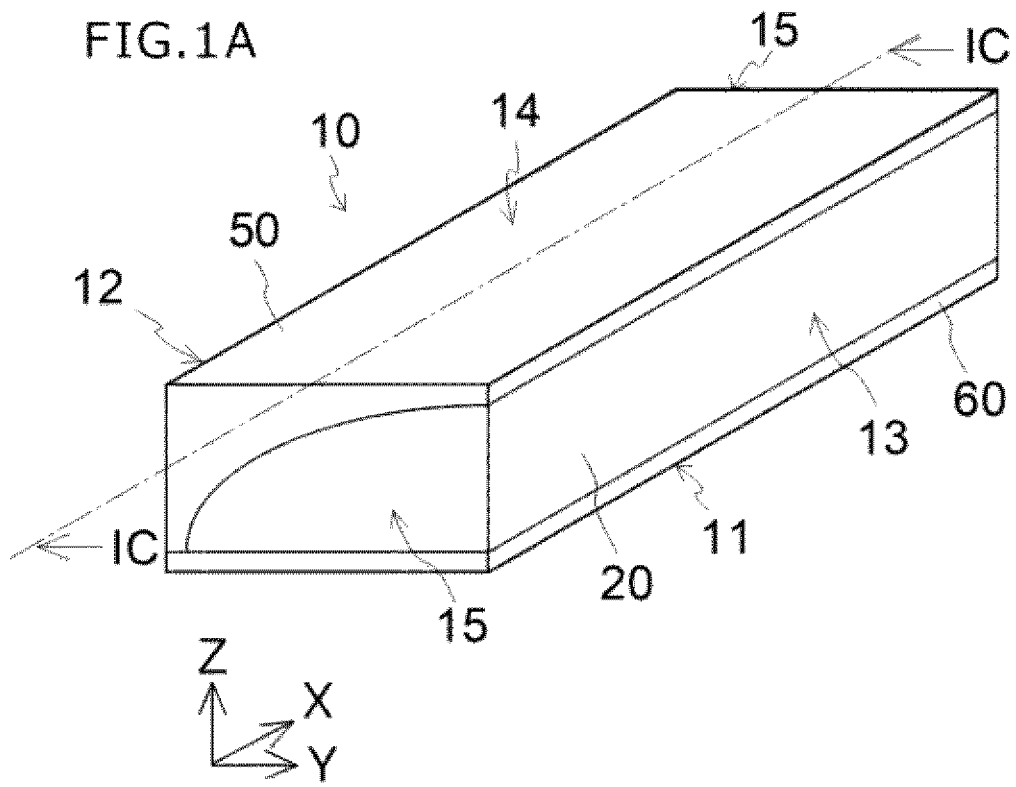
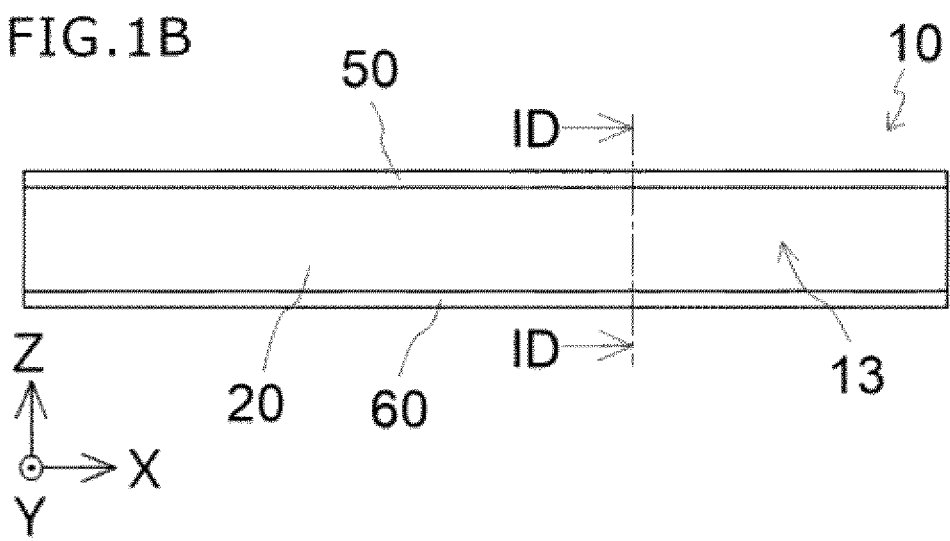

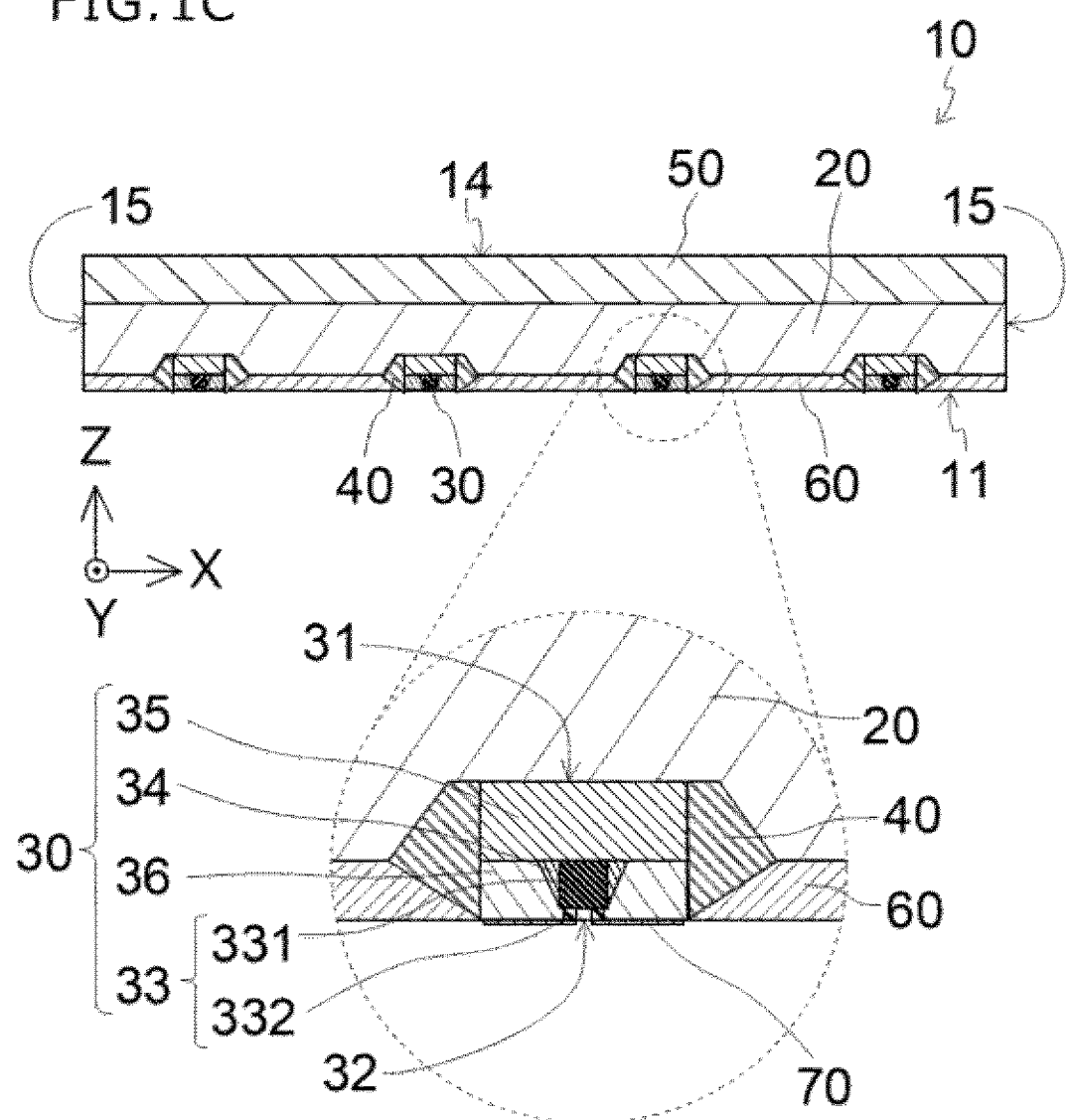

FIG.1D
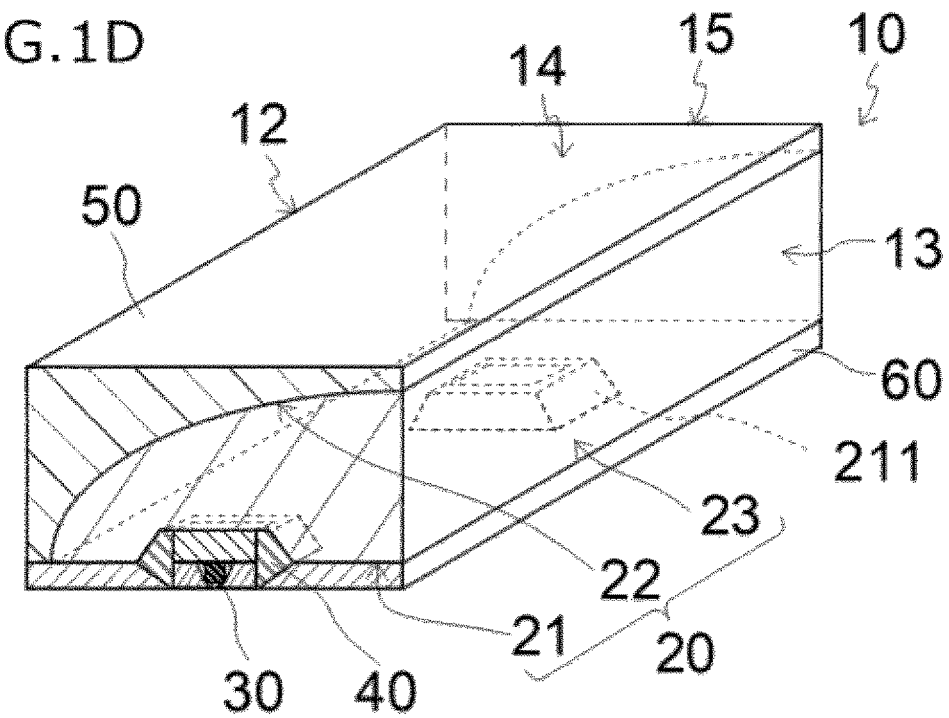
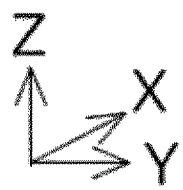
FIG.1E
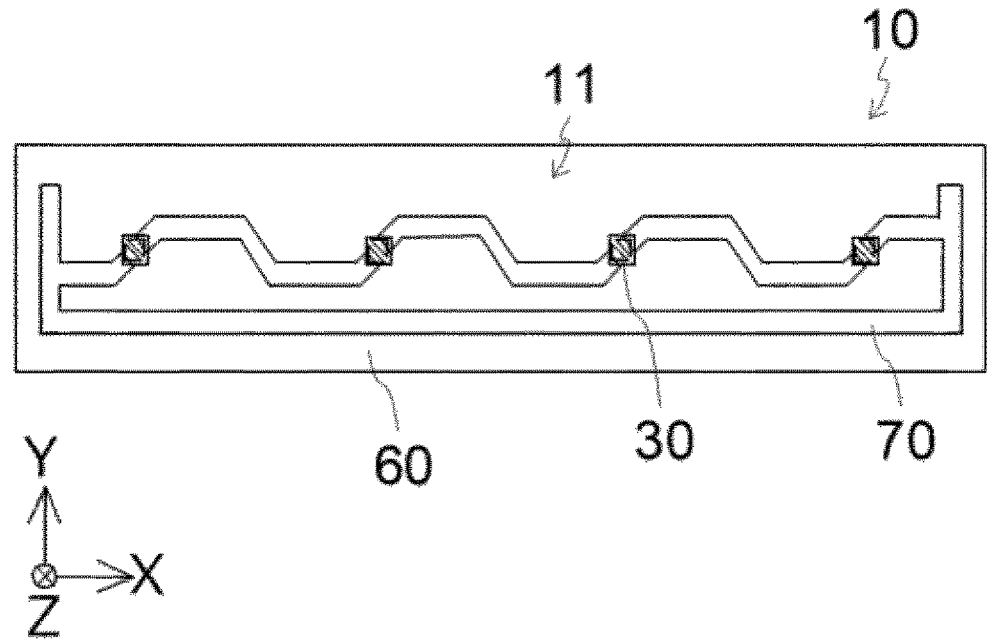

FIG.2A
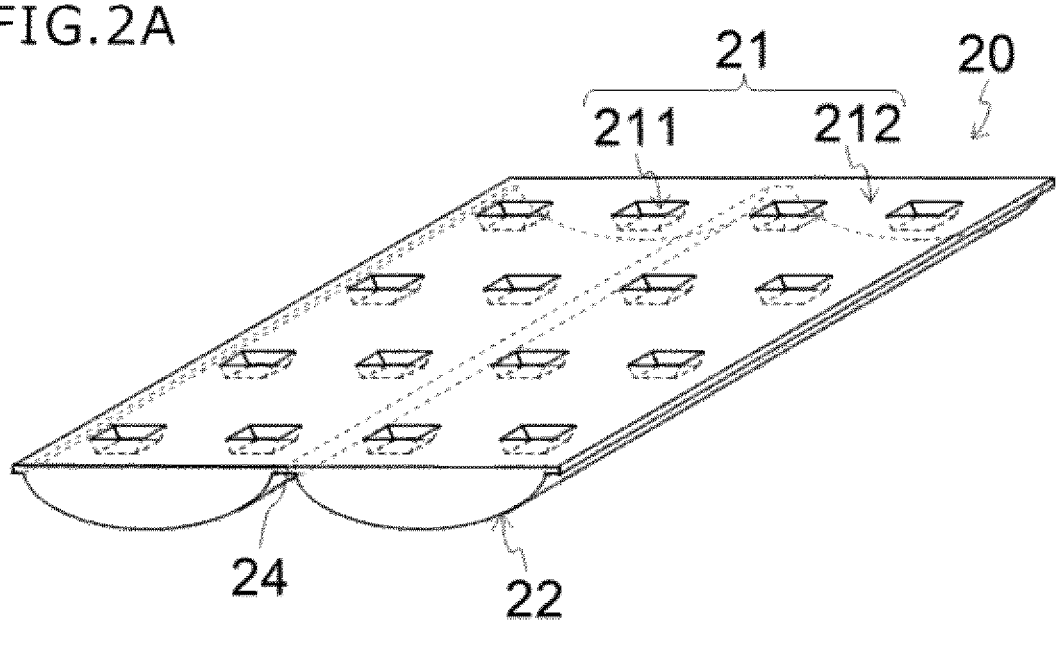
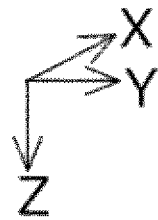

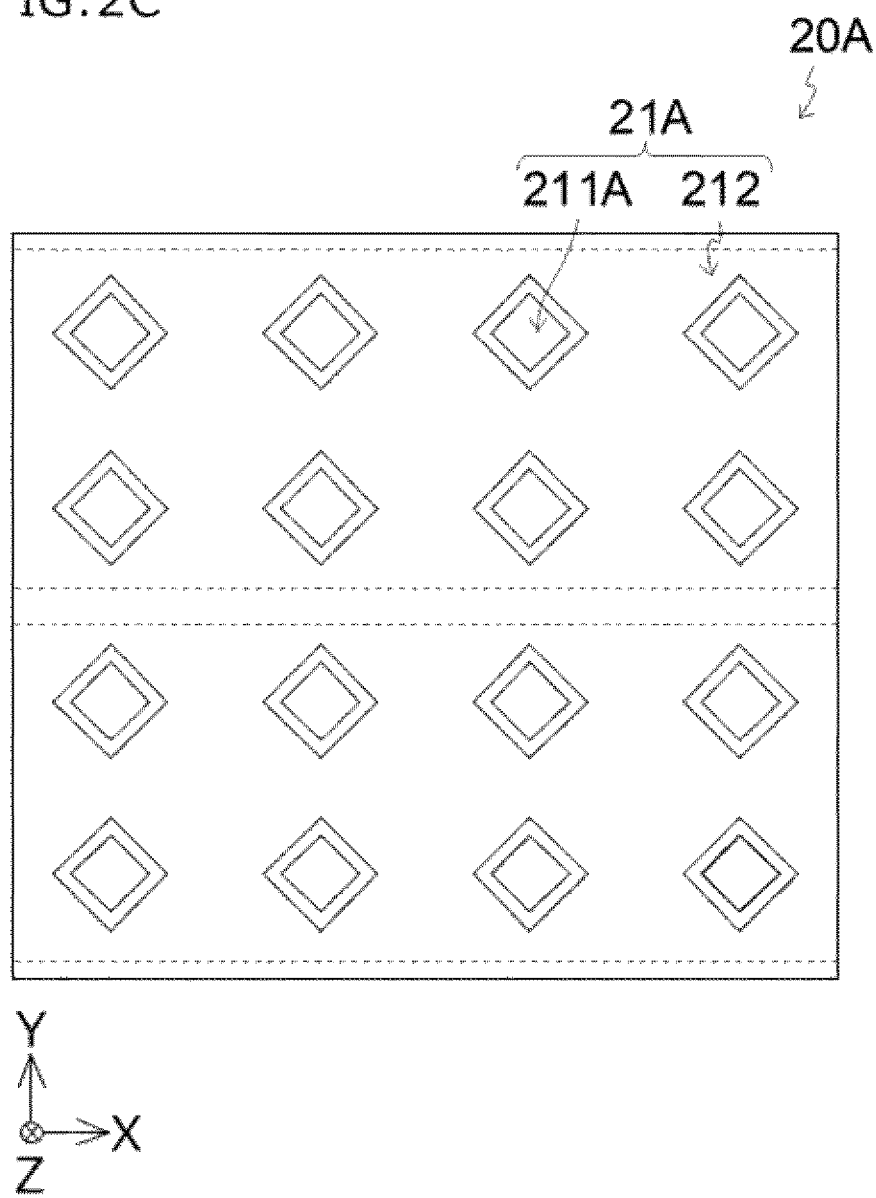

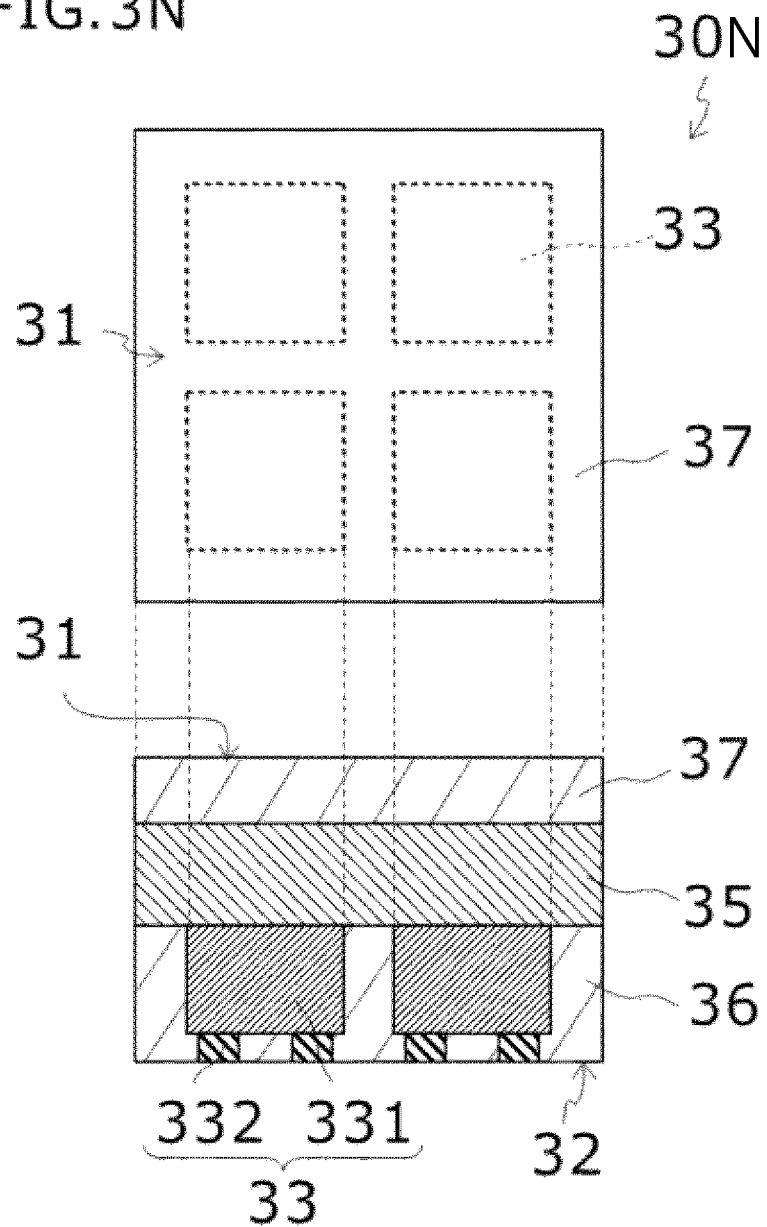

FIG.4A
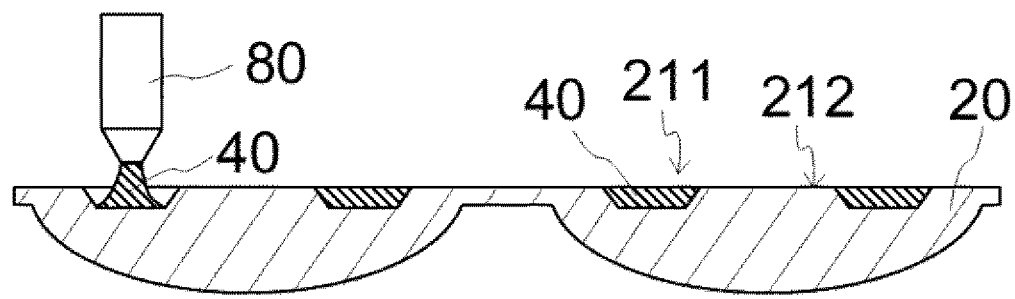
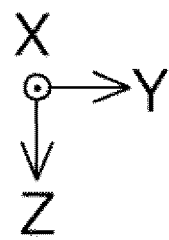
FIG.4B
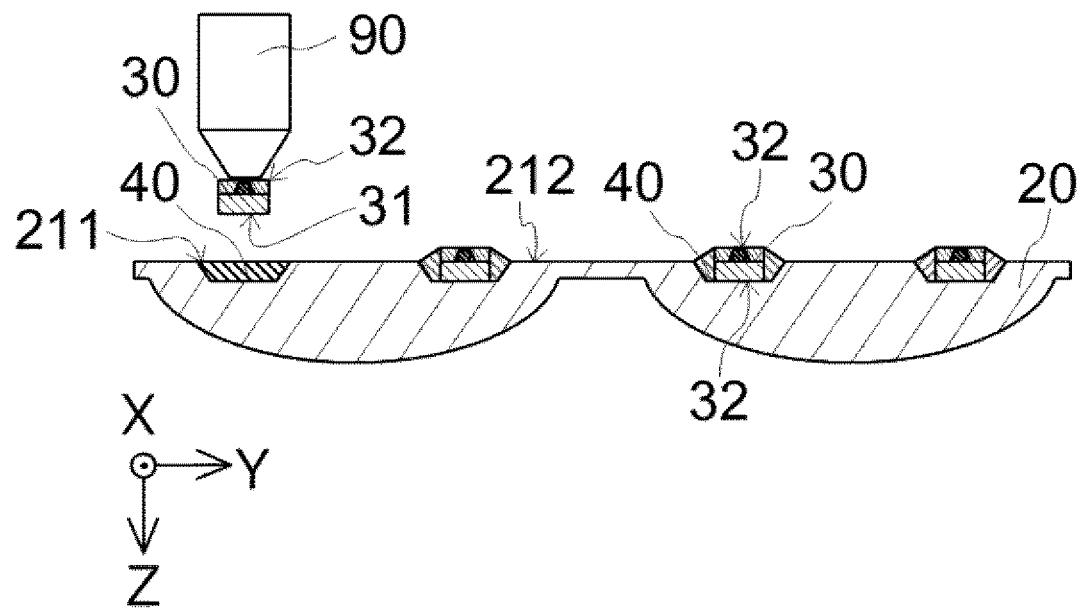
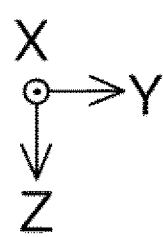

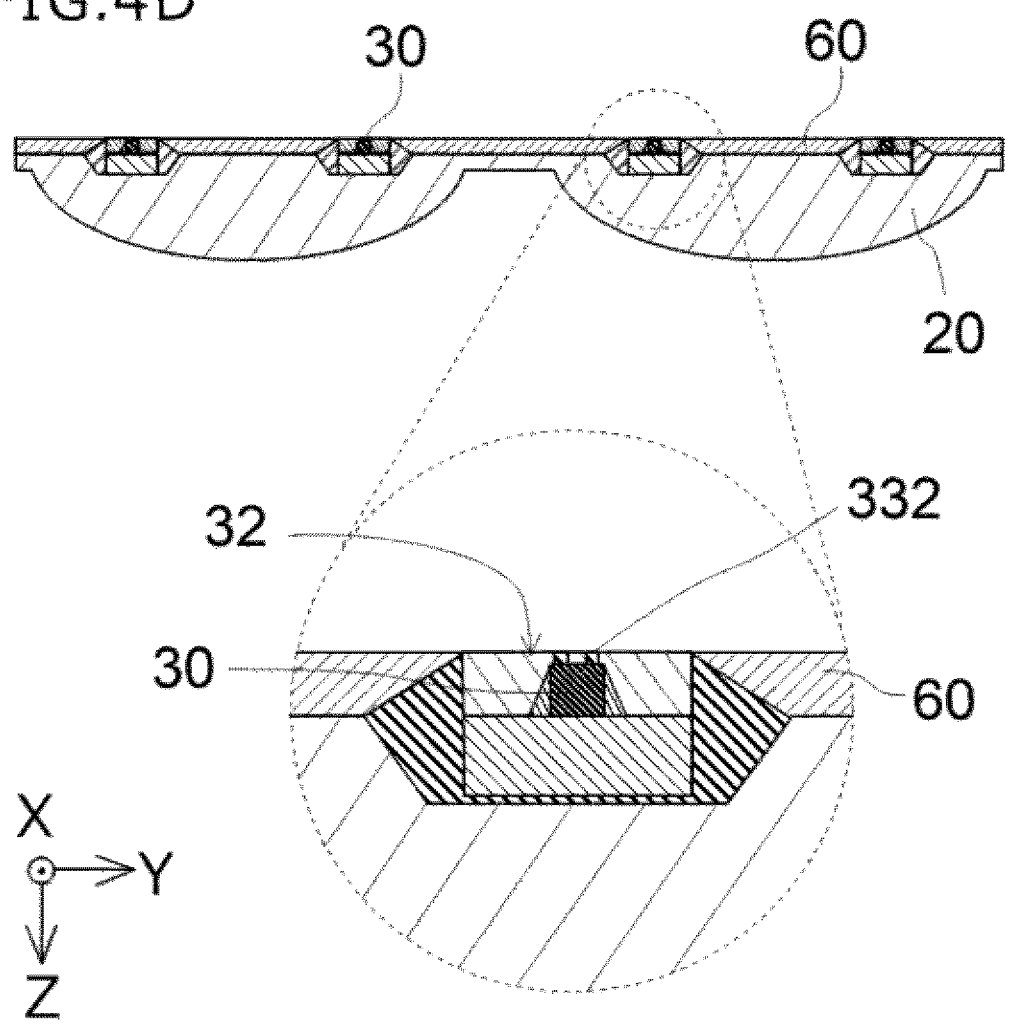

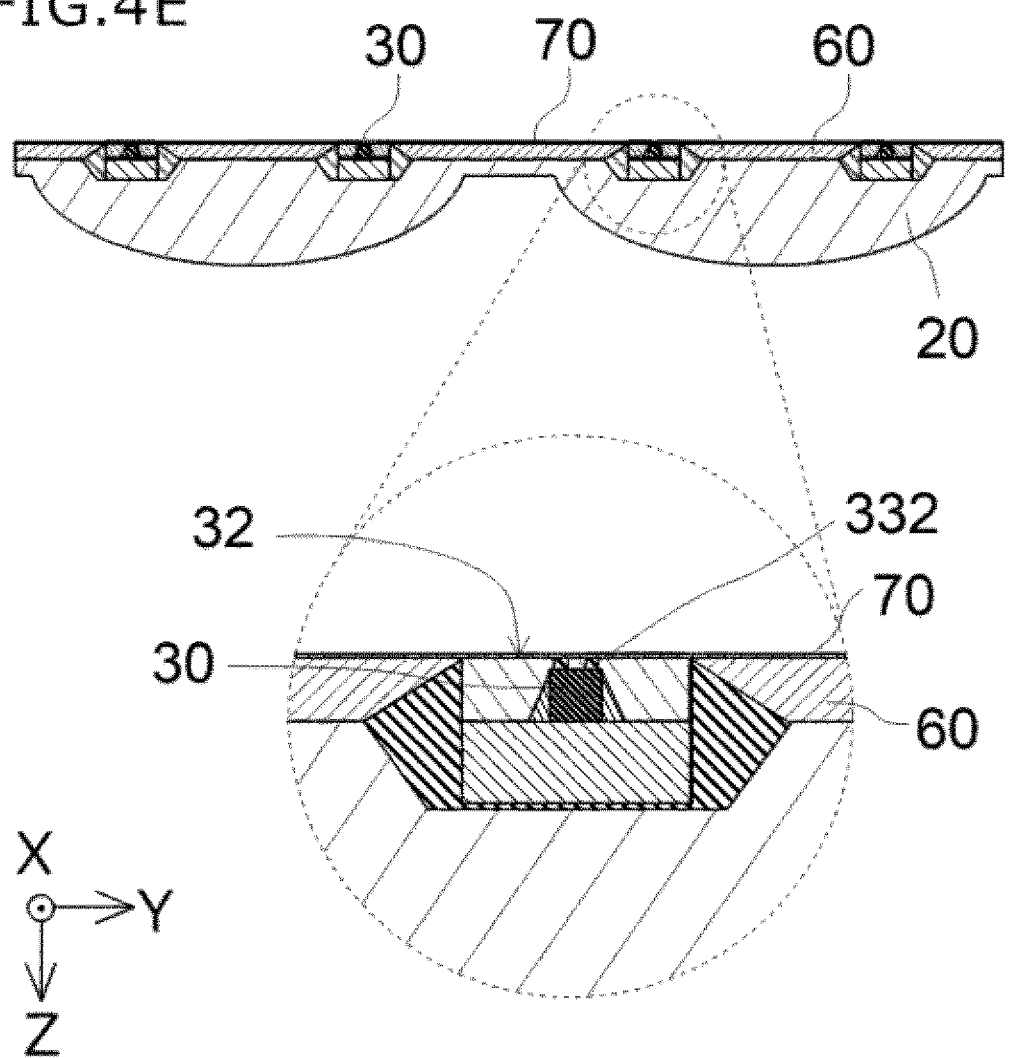

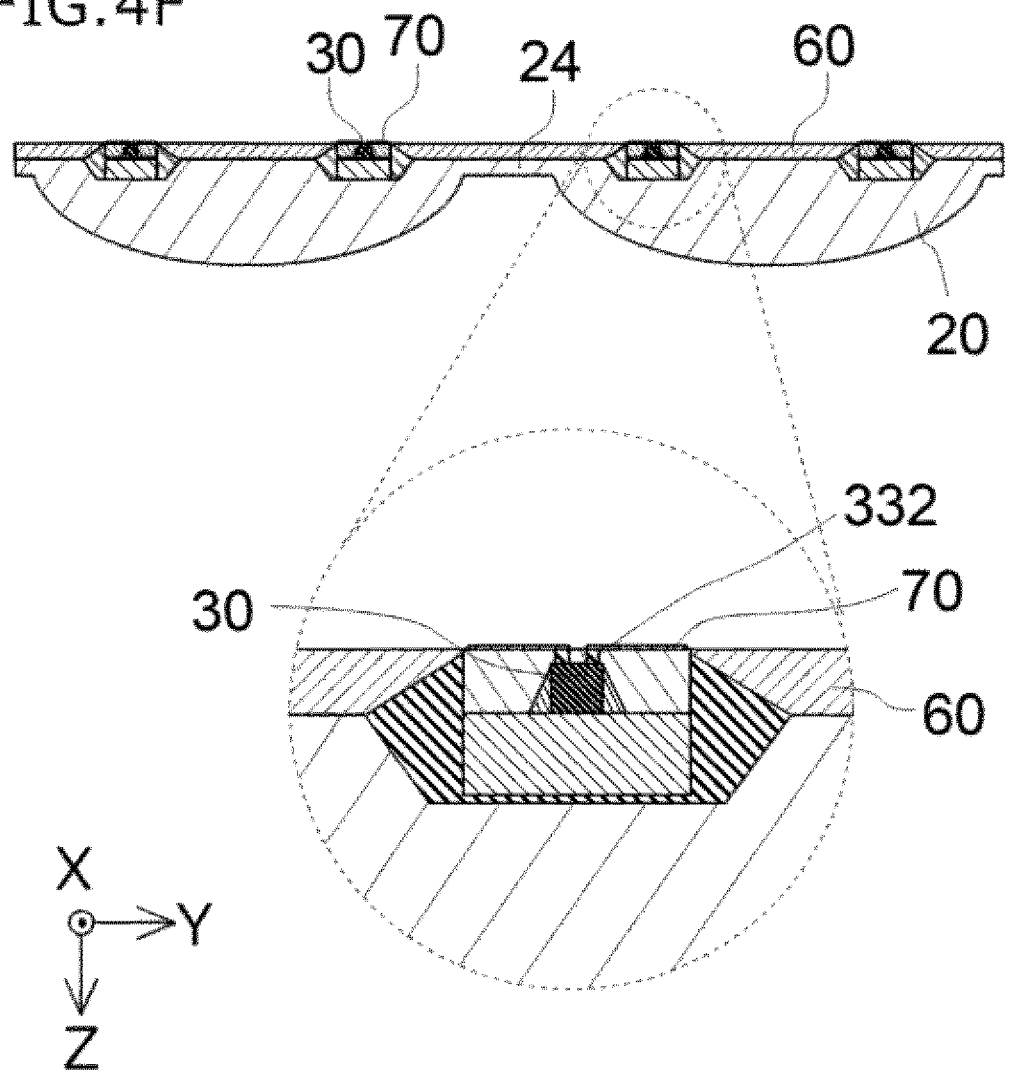

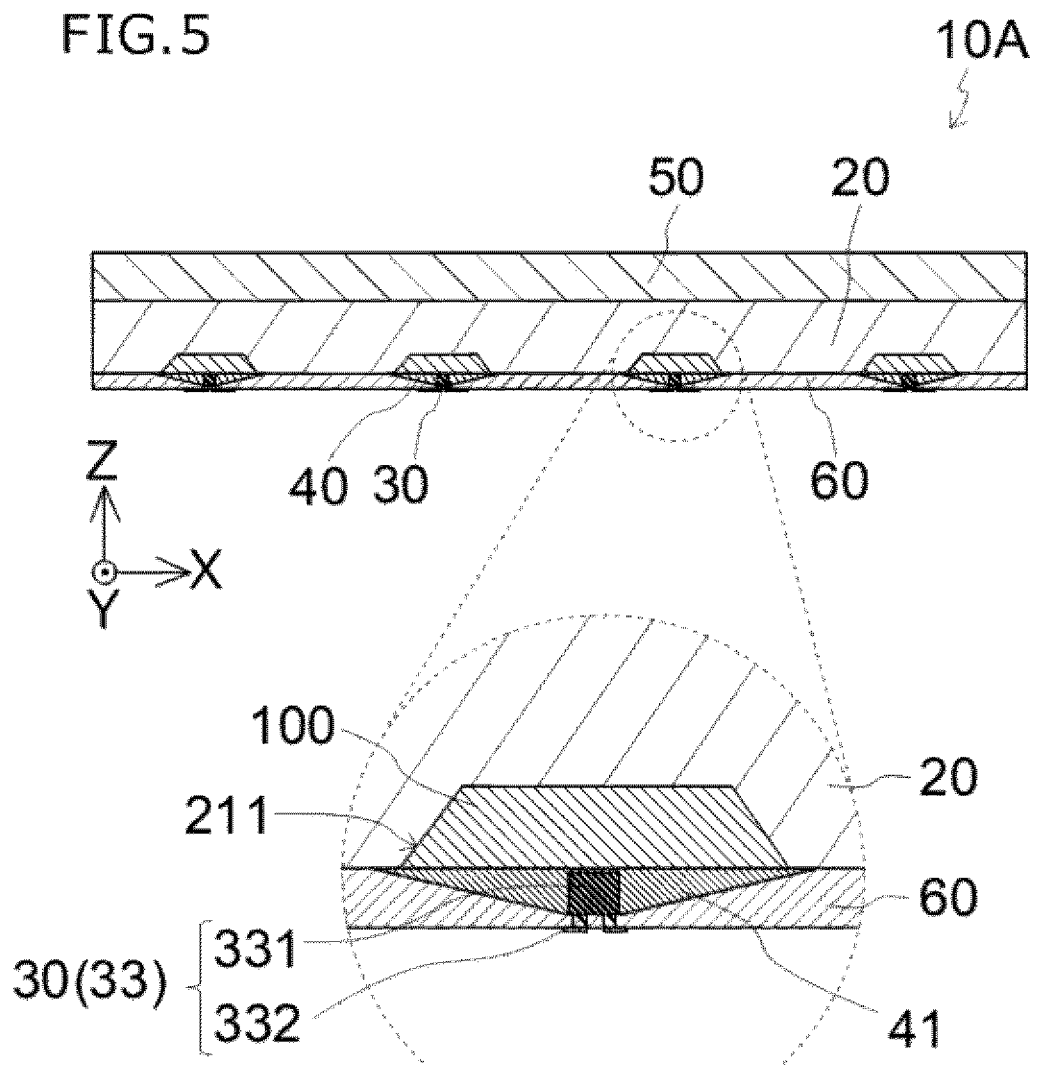

FIG.6C
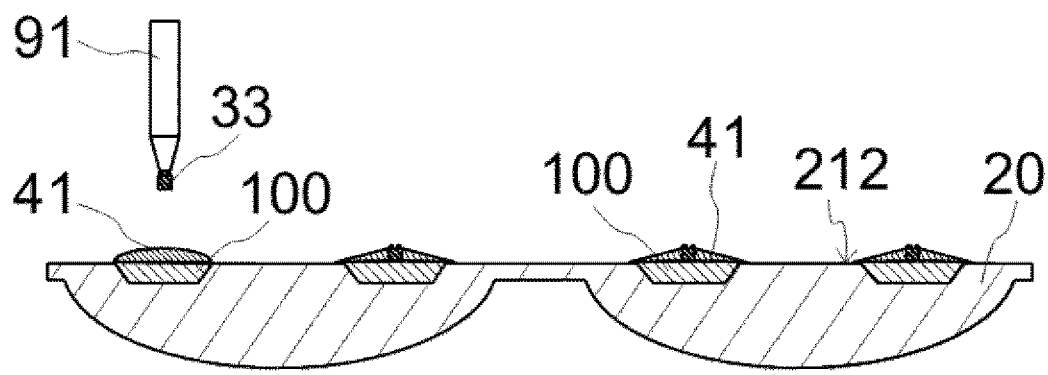
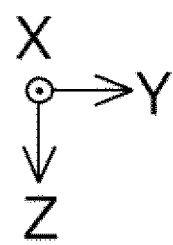
FIG.6D
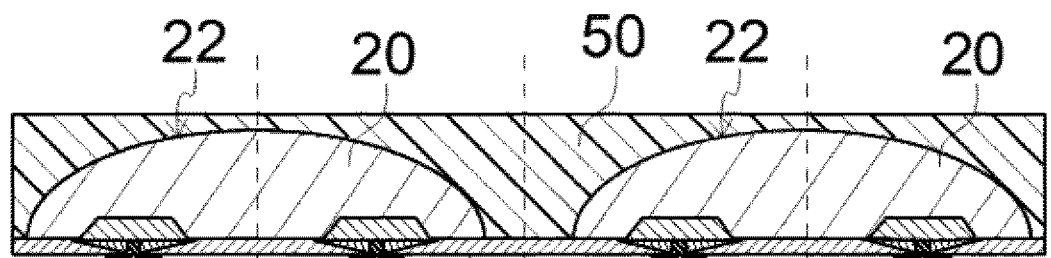
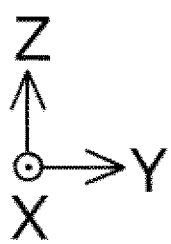

FIG.8A
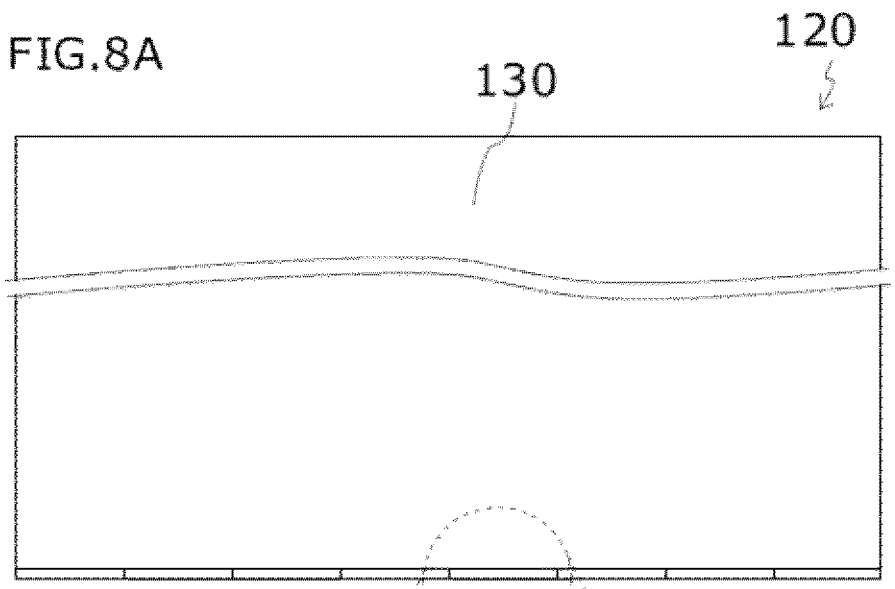
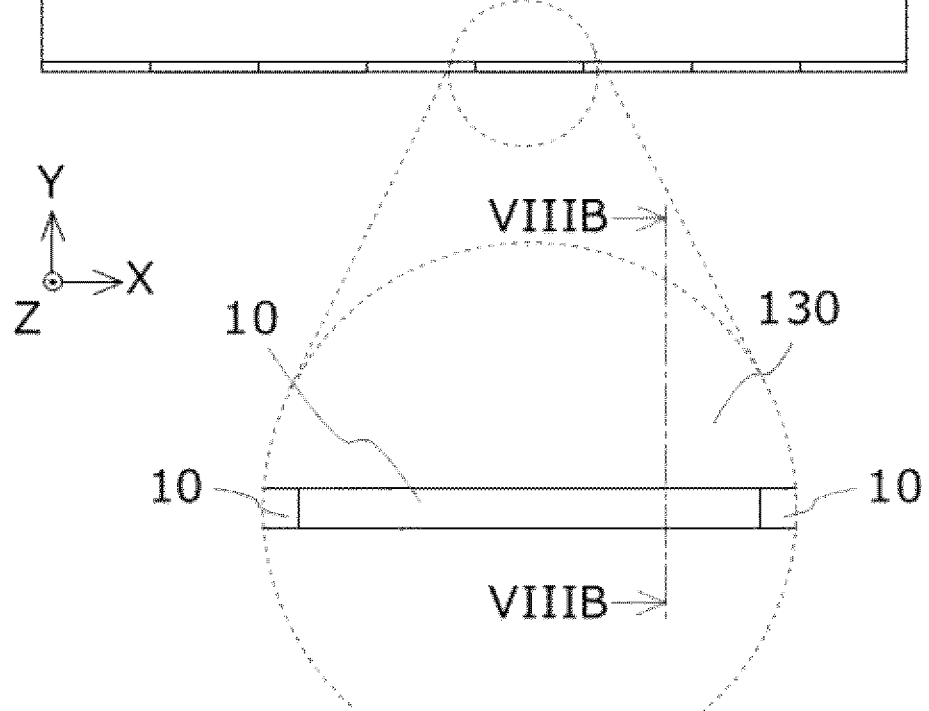

METHOD FOR MANUFACTURING LINEAR LIGHT SOURCE

CROSS-REFERENCE TO RELATED APPLICATIONS

This application claims priority to Japanese Patent Application No. 2019-237949 filed on Dec. 27, 2019. The entire disclosure of Japanese Patent Application No. 2019-237949 is hereby incorporated herein by reference.

TECHNICAL FIELD

The present disclosure relates to a method for manufacturing a linear light source.

BACKGROUND ART

Edge type planar light sources that use a light guide plate and a plurality of light emitting devices for which light is made incident from a side surface of the light guide plate are known as a backlight of a liquid crystal display device. Also, light emitting devices and linear light sources comprising a plurality of light emitting elements in the light emitting device are known. (See Japanese Laid-Open Patent Application Publication No. 2019-036713.)

SUMMARY

The purpose of the present invention is to provide a thin type linear light source.

The method for manufacturing a linear light source of the present disclosure may have the following configurations.

A method for manufacturing a linear light source includes: providing a base having a first surface defining a plurality of recesses arranged in an array extending in a first direction, and a second surface positioned on a side opposite to the first surface, the second surface having a curved contour in a cross section orthogonal to the first direction, and a straight contour in a cross section parallel to the first direction; providing a plurality of light sources each having a top surface and a bottom surface on a side opposite to the top surface, and the bottom surface including a pair of electrodes; placing each of the light sources at a position overlapping a corresponding one of the recesses in a plan view with the top surface of each of the light sources facing a bottom surface of the corresponding one of the recesses; placing a first reflective member to cover the light sources and the first surface of the base so that the electrodes of the light sources are exposed from the first reflective member; placing a second reflective member on the second surface of the base; and cutting the base along the first direction to define a third surface continuous with the first surface and the second surface.

A method for manufacturing a linear light source includes: providing an optical member including a base having a first surface defining a plurality of recesses arranged in an array extending in a first direction, and a second surface positioned on a side opposite to the first surface, the second surface having a curved contour in a cross section orthogonal to the first direction, and a straight contour in a cross section parallel to the first direction, and a reflective member covering the second surface; providing a plurality of light sources each having a top surface, a bottom surface on a side opposite to the top surface, and the bottom surface including a pair of electrodes; placing each of the light sources at a position overlapping a corresponding one of the recesses of the base in a plan view with the top surface of each of the light sources facing a bottom surface of the corresponding one of the recesses; placing a first reflective member to cover the light sources and the first surface of the base so that the electrodes of the light sources are exposed from the first reflective member; and cutting the optical member along the first direction to define a third surface continuous with the first surface and the second surface.

This makes it possible to provide a thin type linear light source.

BRIEF DESCRIPTION OF THE DRAWINGS

FIG. 1A is a schematic perspective view showing an example of a linear light source of a first embodiment.

FIG. 1B is a schematic front view showing an example of the linear light source of the first embodiment.

FIG. 1C is a schematic cross section view of line IC-IC in FIG. 1A.

FIG. 1D is a schematic perspective view including a cross section view of line ID-ID in FIG. 1B.

FIG. 1E is a schematic bottom view showing an example of the linear light source of the first embodiment.

FIG. 2A is a schematic perspective view showing an example of a manufacturing step of the linear light source of the first embodiment.

FIG. 2C is a schematic plan view showing a modified example of a manufacturing step of the linear light source of the first embodiment.

FIG. 3N is a schematic cross section view showing a modified example of the light source used with the method for manufacturing a linear light source of the first embodiment.

FIG. 4A is a schematic cross section view showing an example of a manufacturing step of the linear light source of the first embodiment.

FIG. 4B is a schematic cross section view showing an example of a manufacturing step of the linear light source of the first embodiment.

FIG. 4D is a schematic cross section view showing an example of a manufacturing step of the linear light source of the first embodiment.

FIG. 4E is a schematic cross section view showing an example of a manufacturing step of the linear light source of the first embodiment.

FIG. 4F is a schematic cross section view showing an example of a manufacturing step of the linear light source of the first embodiment.

FIG. 5 is a schematic cross section view showing an example of a linear light source of a second embodiment.

FIG. 6C is a schematic cross section view showing an example of a manufacturing step of the linear light source of the second embodiment.

FIG. 6D is a schematic cross section view showing an example of a manufacturing step of the linear light source of the second embodiment.

FIG. 8A is a schematic plan view of a planar light source using the linear light source of the first embodiment.

DETAILED DESCRIPTION OF EMBODIMENTS

Figure 2B:
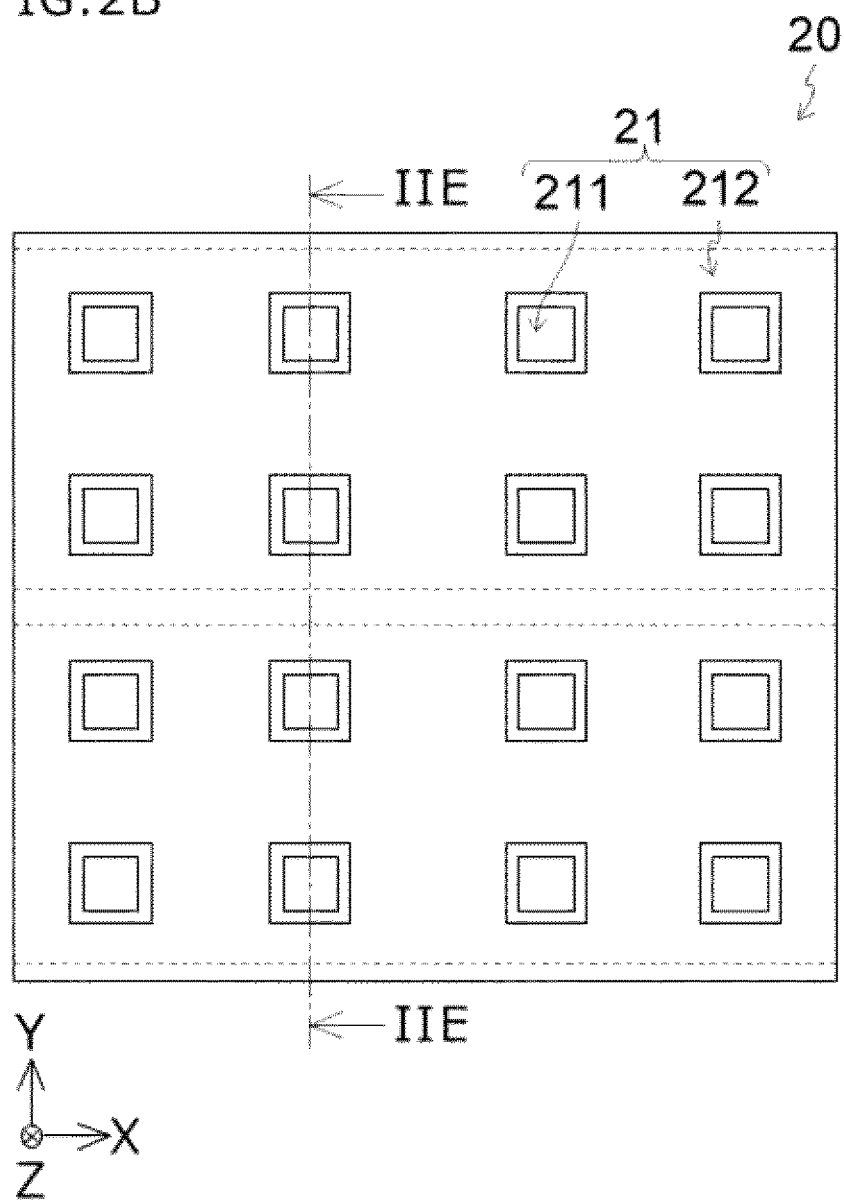
FIG. 2B is a schematic plan view showing the example of the manufacturing step of the linear light source of the first embodiment.

Following, the present invention is explained in detail based on the drawings. In the explanation hereafter, terms indicating a specific direction or position are used as necessary (e.g. "up," "down," and other terms including those terms), but the use of those terms is to make the invention easier to understand with reference to the drawings, and the technical scope of the present invention is not limited by the meaning of those terms. Also, parts with the same code represented in a plurality of drawings indicate the same or similar parts or members. Also, in the present disclosure, unless specifically noted otherwise, "orthogonal" includes cases when two straight lines, sides, surfaces, etc. are in a range of approximately ±5 degrees from 90 degrees. Also, unless specifically noted otherwise, the "same" for length, size, etc. includes cases when the respective values are within a scope of approximately ±10%.

Furthermore, the embodiments shown hereafter are for showing examples of the linear light source to put the technical concept of the present invention into specific form, and do not limit the present invention hereafter. Also, the dimensions, material, shape, relative placement, etc., of constituent components noted hereafter are intended to illustrate an example, and are not intended to limit the scope of the present invention to only that, unless noted specifically. Also, the contents for explaining modes of embodiment and working examples can also be applied to other modes of embodiment and working examples. Also, the size, positional relationship, etc., of the members shown by the drawings may be exaggerated to clarify the explanation.

The linear light source of the embodiment is a long, thin linear light source that can be used as a light source of an edge type planar light source. The linear light source can have light made incident from a side surface of a light guide plate when incorporated in a planar light source. It is possible to incorporate one or a plurality of linear light sources in one planar light source.

The linear light source has a long shape extending in a first direction. The linear light source is a cuboid, for example. The linear light source comprises four surfaces extending in the first direction (X direction). In specific detail, the linear light source comprises a front surface including a light emitting surface, a back surface on the side opposite to the front surface, a bottom surface that includes electrically conductive members and becomes a mounting surface, and a top surface on the side opposite to the bottom surface. These four surfaces have the same length in the first direction. Also, the linear light source comprises two side surfaces orthogonal to the first direction.

The size of the linear light source can have an X direction length of 2 mm to 500 mm, a Y direction length of 0.5 mm to 5 mm, and a Z direction length of 0.1 mm to 2 mm, for example.

The linear light source comprises at least a base, a light source, a joining member, a first reflective member, and a second reflective member. Furthermore, it comprises electrically conductive members that are electrically connected to electrodes of the light source exposed to the outside.

The base comprises a first surface, a second surface, and a third surface extending in the first direction. The first surface comprises a plurality of recesses arrayed in the first direction. The first surface is a planar section except for the recesses. The second surface is a curved surface. In specific detail, the second surface is curved (has a curved contour) in the cross section at which the base is orthogonal to the first direction, and is straight (has a straight contour) in the cross section parallel to the first direction. The third surface is a planar shape, and becomes the light emitting surface of the linear light source.

The light source is placed in the recess. The first reflective member covers the planar section of the first surface of the base. The first reflective member covers the light source. The second reflective member covers the second surface of the base. The first reflective member and the second reflective member are in contact. The first reflective member and the second reflective member do not cover the third surface of the base.

The light source emits light by the electrically conductive members being energized. The light from the light source is made incident on the inside of the base from the bottom surface and/or the side surface of the recesses of the first surface of the base. The light made incident on the inside of the base is reflected by the planar section of the first surface or by the second surface, after which it is discharged to outside from the third surface.

Following, this kind of method for manufacturing a linear light source is explained.

First Embodiment

FIG. 1A to 1E are drawings showing examples of the linear light source obtained with the method for manufacturing a linear light source of the first embodiment. A linear light source 10 comprises a base 20, a light source 30, a first reflective member 50, and a second reflective member 60. The light source 30 is joined with the base 20 with a joining member 40 interposed.

This kind of method for manufacturing a linear light source 10 is explained hereafter.

FIG. 2A to FIG. 4I show examples of the method for manufacturing a linear light source of the present embodiment.

(Step for Preparing Base)

First, the base 20 is prepared. FIG. 2A shows an example of the base 20, and illustrates an item of a size for which it is possible to form four linear light sources all at once. A third surface 23 of the base 20 which becomes a light emitting surface 13 of the linear light source 10 shown in FIG. 1A is not formed yet at this point.

The base 20 comprises a first surface 21, and a second surface 22 positioned at the side opposite to the first surface 21.

The planar view shape of first surface 21 is rectangular. The shape of the first surface 21 is not limited to this. The first surface 21 comprises a plurality of recesses 211 arrayed in a first direction. With the example shown in FIG. 2B, shown is an example in which four recesses 211 are placed in the first direction. Also, four rows are placed for the rows comprising four recesses 211 placed in the first direction. The number of recesses 211, the interval of the recesses 211, etc., in the first direction are not limited to this, and these can be selected as appropriate according to the purpose, application, etc.

The shape of the opening of the recess 211 is a square shape. One side of the square of the recess 211 is placed to be parallel to the first direction. The shape of the bottom surface of the recess 211 is a square shape. Using this kind of shape makes it easy to place the light source in a prescribed position in the step for placing the light source. Also, it is preferable that the side surface of the recess 211 be inclined. By having the side surface of the recess 211 inclined, it is possible to suppress position displacement of the light source in the step for placing the light source. The center of the bottom surface of the recess 211 and the center of the opening are matched. This makes it possible to emit light of the light source to the light emitting surface side with good efficiency.

The side surface of the recess 211 can be inclined by 45 degrees to 90 degrees, for example. This makes it possible to suppress position displacement of the light source in the step for placing the light source. Also, the side surface of the recess 211 may be straight in the cross section view, or may be a concave or convex curve. It is particularly preferable that the side surface of the recess 211 be straight in the cross section view. This makes it possible to stabilize light extraction from the light source. The depth of the recess 211 can be 50% to 100% of the height of the light source, for example.

The shape of the opening and the shape of the bottom surface of the recess 211 may be the same, or may be different. The size of the bottom surface of the recess 211 is a size that allows mounting of the light source. The surface area of the bottom surface of the recess 211 can be a size that is 103% to 300% of the surface area of the light source, for example.

FIG. 2C shows a modification example of the base. In a base 20A, the shape of the opening of a recess 211A is a square shape. One side of the square shape of the recess 211A is placed to rotate 45 degrees from the first direction. By placing in this way, the light from the light source is more easily emitted from each side of the recess 211A to inside the base with good efficiency. In other words, in the emitting surface formed by the step described hereafter, light is emitted more easily facing between the light sources. Between the light sources is a part that easily becomes dark, and by emitting light facing that kind of part, it is possible to reduce luminance unevenness within the light emitting surface.

Figure 2D:
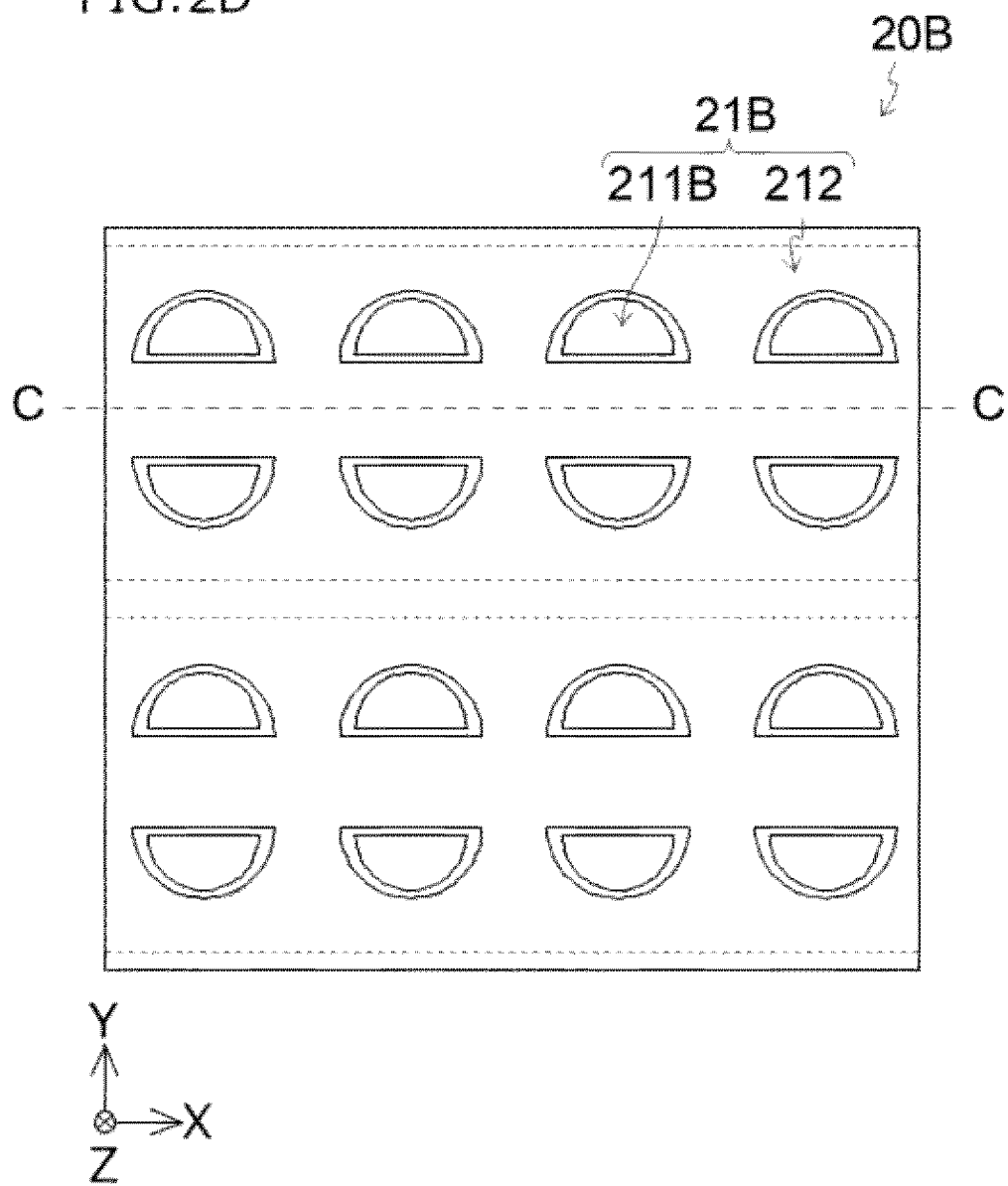
FIG. 2D is a schematic plan view showing a modified example of a manufacturing step of the linear light source of the first embodiment.
Figure 2E:
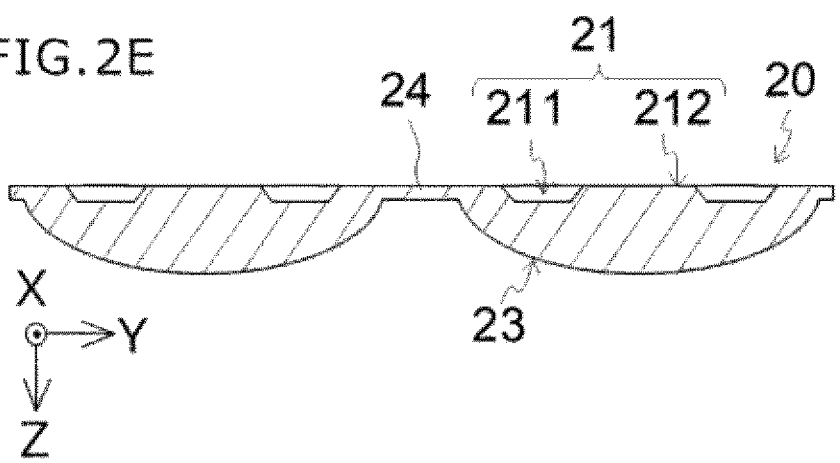
FIG. 2E is a schematic cross section view of line IIE-IIE in FIG. 2B.

FIG. 2D shows another modification example of the base. With a base 20B, the shape of the opening and the shape of the bottom surface of a recess 211B is a semicircle shape. The straight line part of the semicircle is placed to be parallel to the first direction. Line C-C in FIG. 2D is a line that is cut in a later step and becomes the light emitting surface, and the recesses 211B are placed sandwiching this line C-C so that the straight line parts face each other. Using this kind of shape for the recess 211B makes it possible to stabilize the extraction of light from the light source.

However, the shape of the opening and the shape of the bottom surface of the recess 211 is not limited to this, and can also be a circle, an oval, a hexagon, an octagon, etc.

A planar section 212 of the periphery of the recess 211 is a flat surface. The planar section 212 may also have fine recesses and projections formed.

Also on the first surface 21 of the base 20, in addition to the recesses 211 in which the light sources are placed, it is also possible to comprise a groove or cavity for placing a first reflective member described later.

The second surface 22 of the base 20 has a curved shape. In specific detail, the second surface 22 is curved (has a curved contour) in the cross section orthogonal to the first direction. Here, an example is shown in which this is an arc shaped curve such as a semicircle, a semi-ellipse, etc. Also, the second surface 22 is straight (has a straight contour) at the cross section parallel to the first direction. Said another way, the second surface 22 can also be said to be a curved surface that is a portion of the side surface of a semicircular column, a semi-elliptical column, etc.

With the example shown in FIG. 2A, the base 20 comprises two second surfaces 22 that are curved in the cross section orthogonal to the first direction. However, the invention is not limited to this, and it is also possible to comprise one, or three or more second surfaces 22.

On the first surface 21 of the side opposite to one second surface 22, two recesses 211 are respectively placed in the cross section orthogonal to the first direction. Each recess 211 is placed on the first surface 21 facing a position separated from the center of the second surface 22 in the cross section orthogonal to the first direction. This is because in a step described later, it is cut in the direction parallel to the first direction in the center of the second surface 22.

In the cross section orthogonal to the first direction, the recess 211 placed on the side opposite to one second surface 22 can be placed at a position so that the distance to the end of the second surface 22 is further than the distance to the center of the second surface 22. In other words, after cutting the base 20, it is possible to place the light source at a position near the third surface that becomes the light emitting surface. This makes it possible to emit light from the light source to outside with good efficiency.

Alternatively, in the cross section orthogonal to the first direction, the recess 211 placed at the side opposite to one second surface 22 can be placed at a position so that the distance to the end of the second surface 22 is closer than the distance to the center of the second surface 22. In other words, after cutting of the base 20, it is possible to place the light source at a position far from the third surface that becomes the light emitting surface. This makes it possible to expand the light within the base 20, and to emit uniform light from a broad range of the third surface that becomes the light emitting surface to outside.

In the cross section orthogonal to the first direction, when a plurality of second surfaces 22 are comprised, each of the second surfaces 22 may be in contact with the adjacent second surface 22, or may be separate. With the example shown in FIG. 2A, the two second surfaces 22 are separate. A linking part 24 is placed between two second surfaces 22. This linking part 24 is removed in a later step. By comprising the linking part 24, it is possible to make it difficult for position displacement to occur when cutting the base, making it possible to do stable cutting. Also, by cutting the linking part 24, it is possible to have a curved line up to the end part of the second surface 22 in the cross section view.

The first surface 21 that is positioned on the side opposite to the linking part 24 may be the same surface as the first surface 21 positioned at the side opposite to the second surface 22, or may be a part having a different height such as by comprising a recess or a projection, etc. As shown in FIG. 2A, the linking part 24 can be the same length as the base 20 in the first direction. In other words, it is possible for two second surfaces 22 to be integrated by one linking part 24. It is also possible for the linking part 24 to have a shorter length than the length of the base 20 in the first direction. In this case, there may be one or a plurality of the linking part 24.

As the material of the base 20, it is possible to use a resin material such as a thermoplastic resin such as acrylic, polycarbonate, cyclic polyolefin, polyethylene terephthalate, polyester, etc., a thermosetting resin material such as epoxy, silicone, etc., or an optically transparent material such as glass. The thermosetting resin material is particularly preferable because manufacturing with good efficiency is possible using injection molding. Among these, polycarbonate is preferable because it has a high level of transparency and is inexpensive. Also, it is possible to reduce the cost of the light emitting module (the linear light source) by using an inexpensive material such as polyethylene terephthalate, etc.

(Step for Preparing Light Source)

Figure 3A:
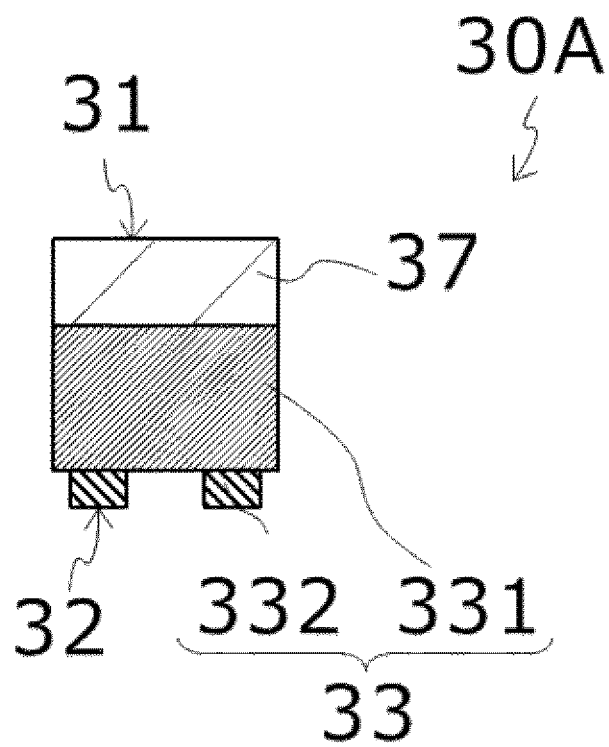
FIG. 3A is a schematic cross section view showing an example of the light source used with the method for manufacturing a linear light source of the first embodiment.
Figure 3B:
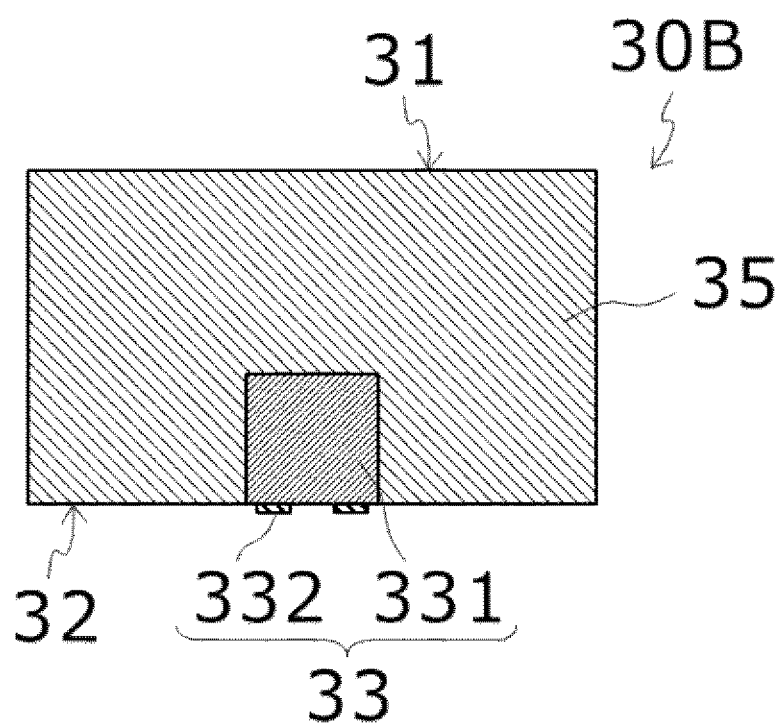
FIG. 3B is a schematic cross section view showing a modified example of the light source used with the method for manufacturing a linear light source of the first embodiment.
Figure 3C:
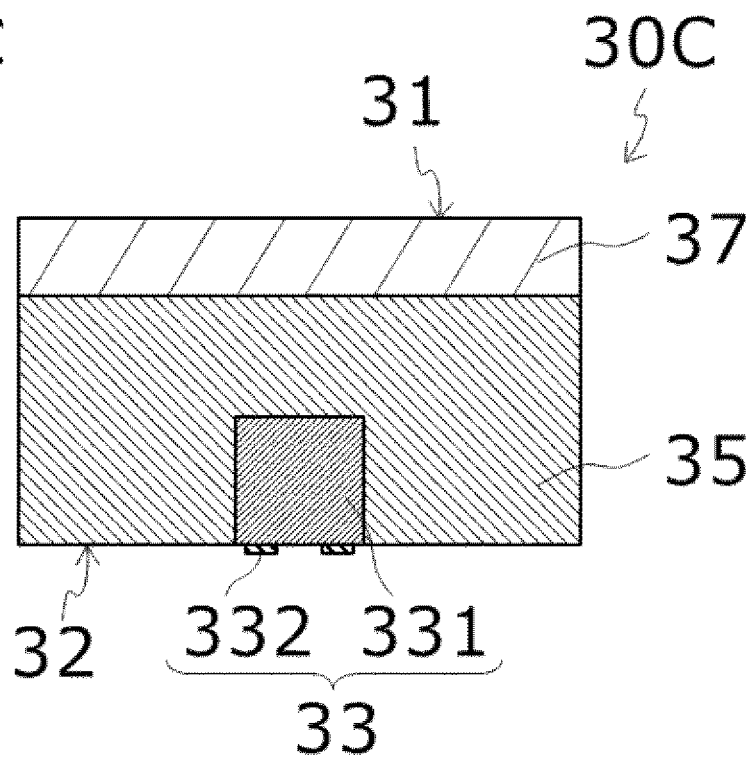
FIG. 3C is a schematic cross section view showing a modified example of the light source used with the method for manufacturing a linear light source of the first embodiment.
Figure 3D:
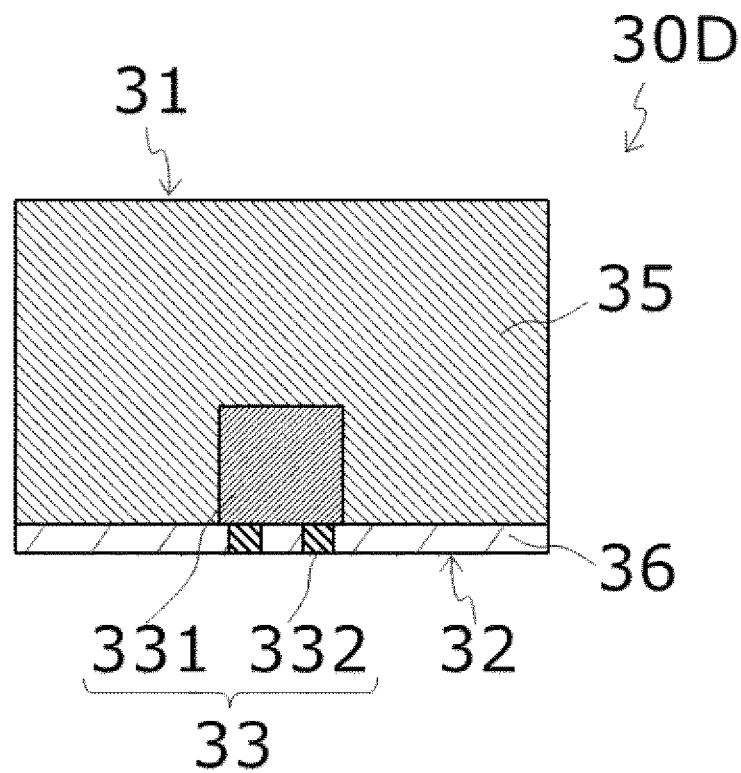
FIG. 3D is a schematic cross section view showing a modified example of the light source used with the method for manufacturing a linear light source of the first embodiment.
Figure 3E:
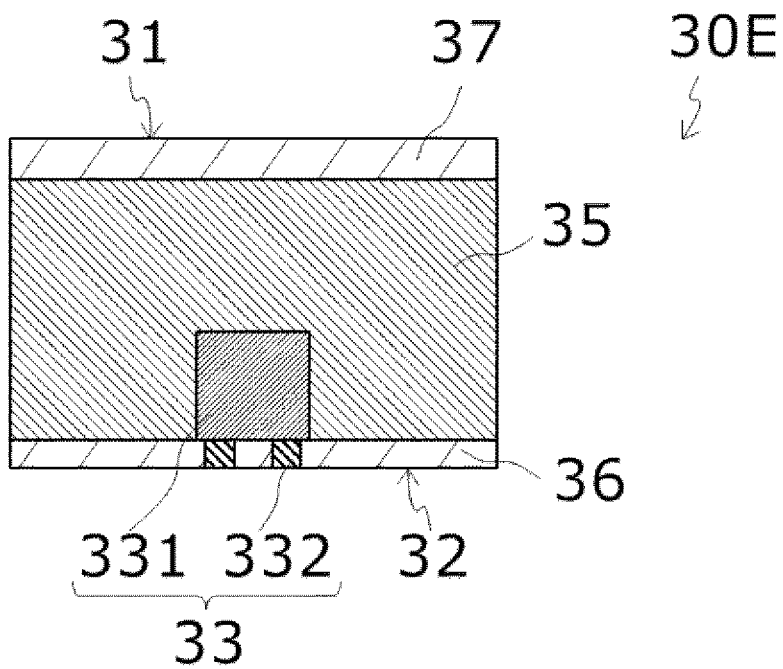
FIG. 3E is a schematic cross section view showing a modified example of the light source used with the method for manufacturing a linear light source of the first embodiment.
Figure 3F:
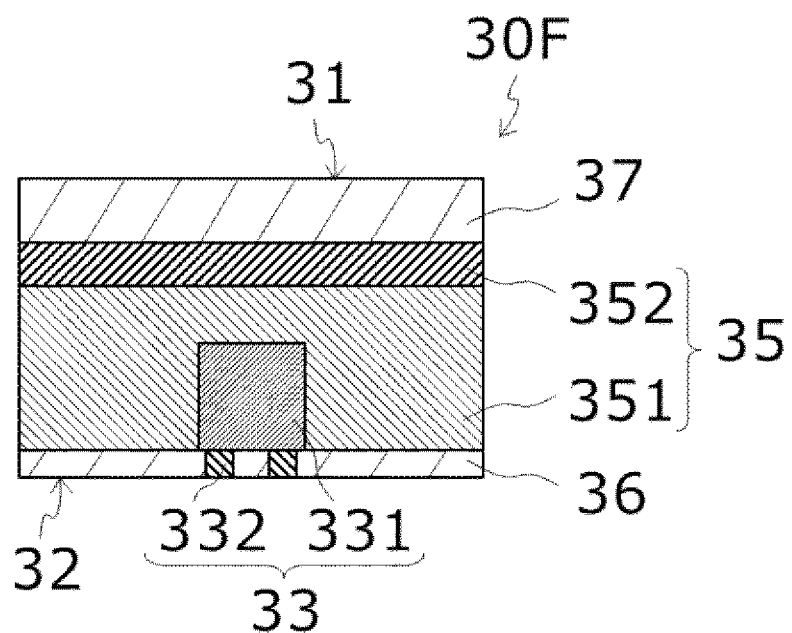
FIG. 3F is a schematic cross section view showing a modified example of the light source used with the method for manufacturing a linear light source of the first embodiment.
Figure 3G:
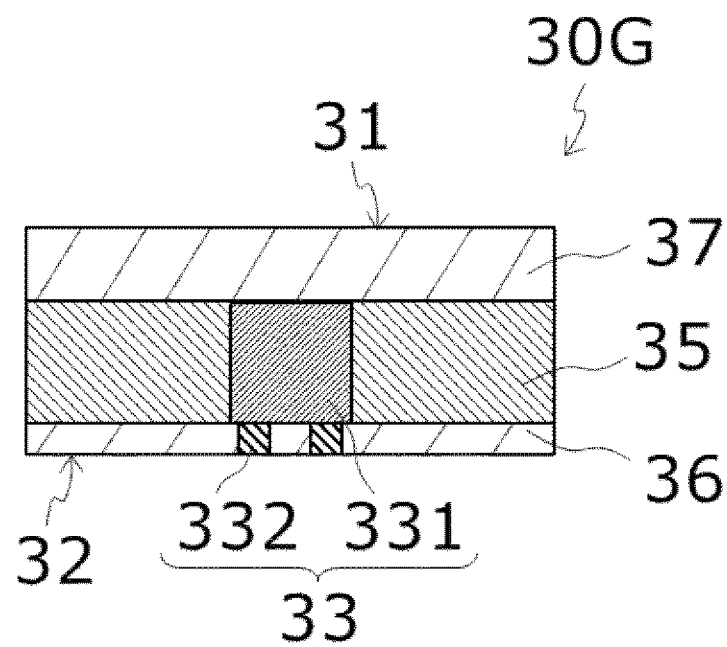
FIG. 3G is a schematic cross section view showing a modified example of the light source used with the method for manufacturing a linear light source of the first embodiment.
Figure 3H:
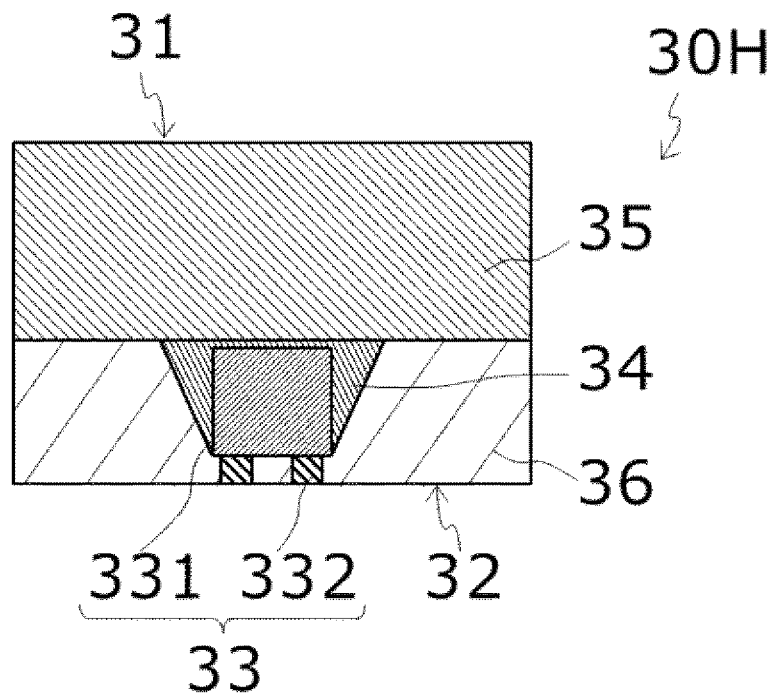
FIG. 3H is a schematic cross section view showing a modified example of the light source used with the method for manufacturing a linear light source of the first embodiment.
Figure 3I:
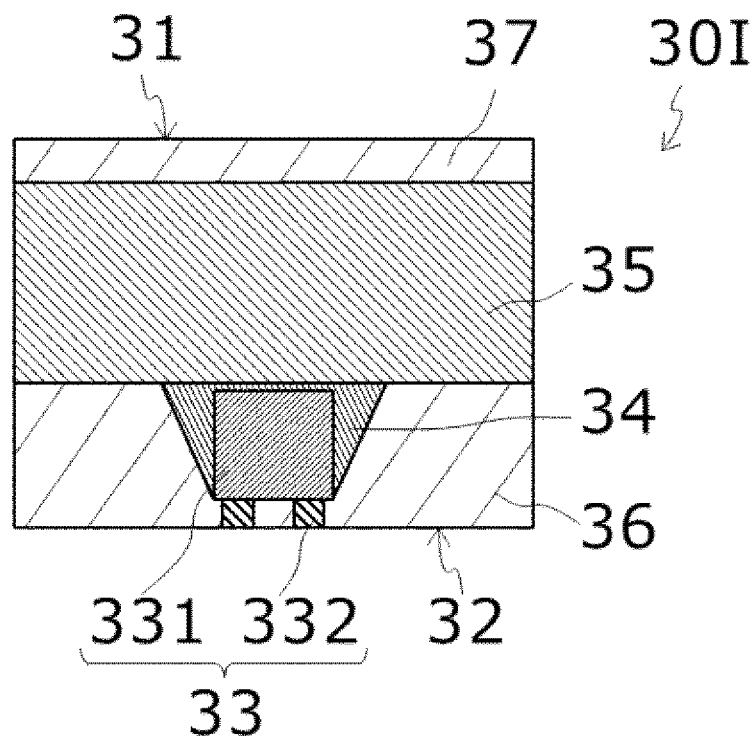
FIG. 3I is a schematic cross section view showing a modified example of the light source used with the method for manufacturing a linear light source of the first embodiment.
Figure 3J:
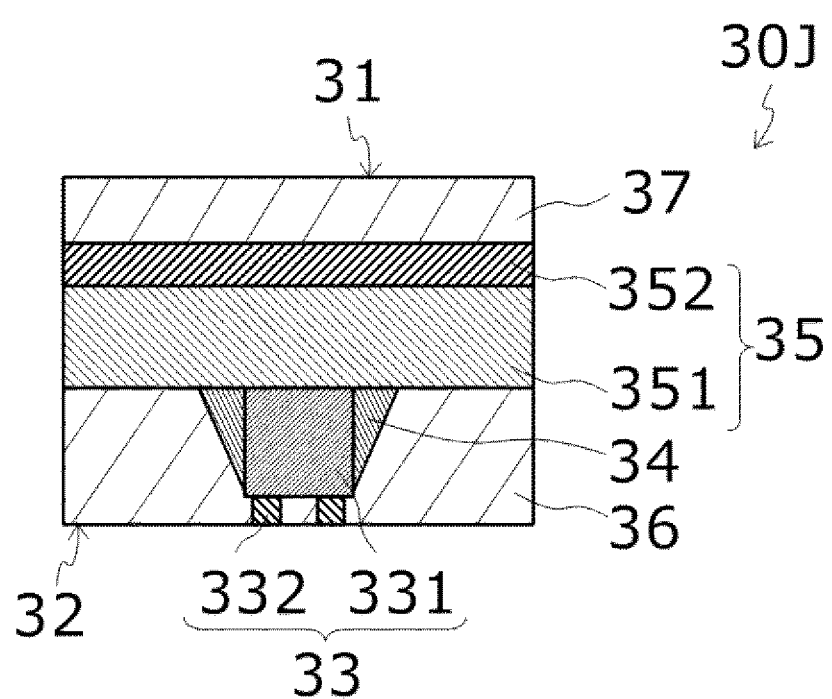
FIG. 3J is a schematic cross section view showing a modified example of the light source used with the method for manufacturing a linear light source of the first embodiment.
Figure 3K:
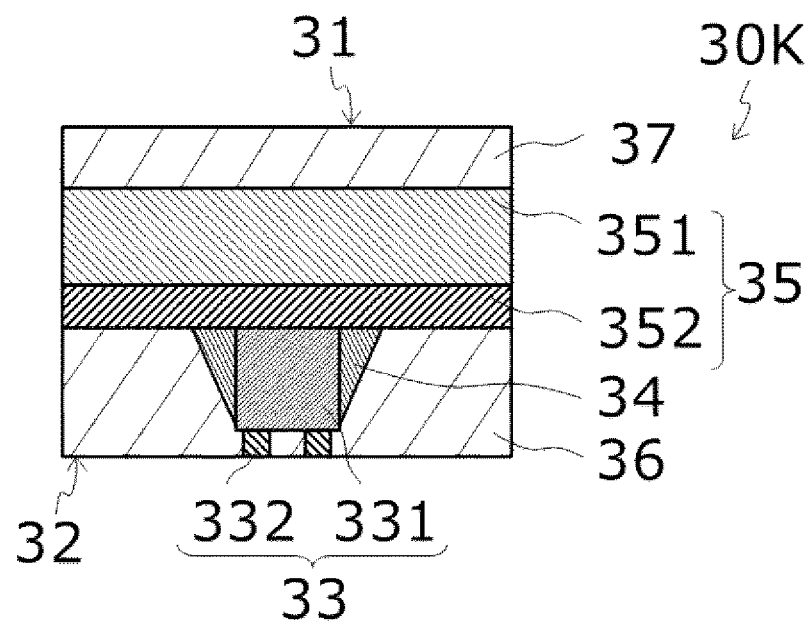
FIG. 3K is a schematic cross section view showing a modified example of the light source used with the method for manufacturing a linear light source of the first embodiment.
Figure 3L:
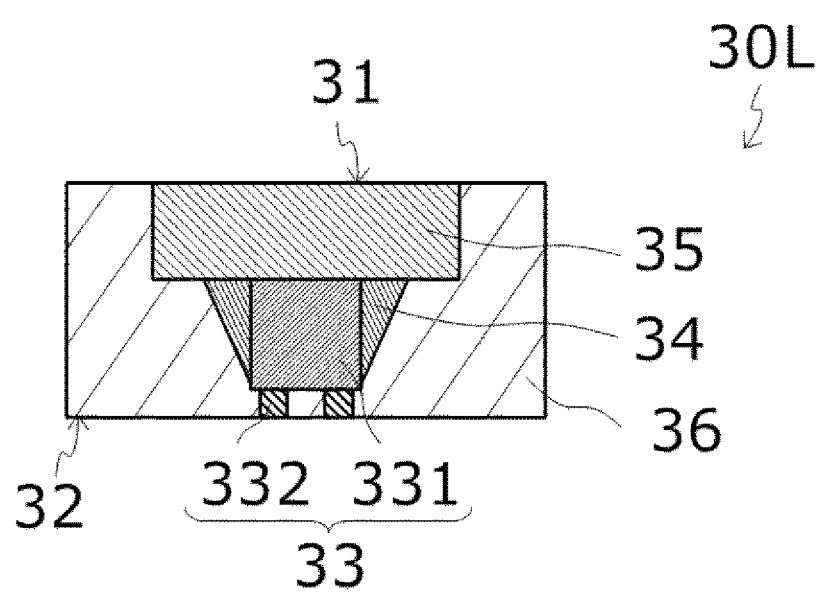
FIG. 3L is a schematic cross section view showing a modified example of the light source used with the method for manufacturing a linear light source of the first embodiment.
Figure 3M:
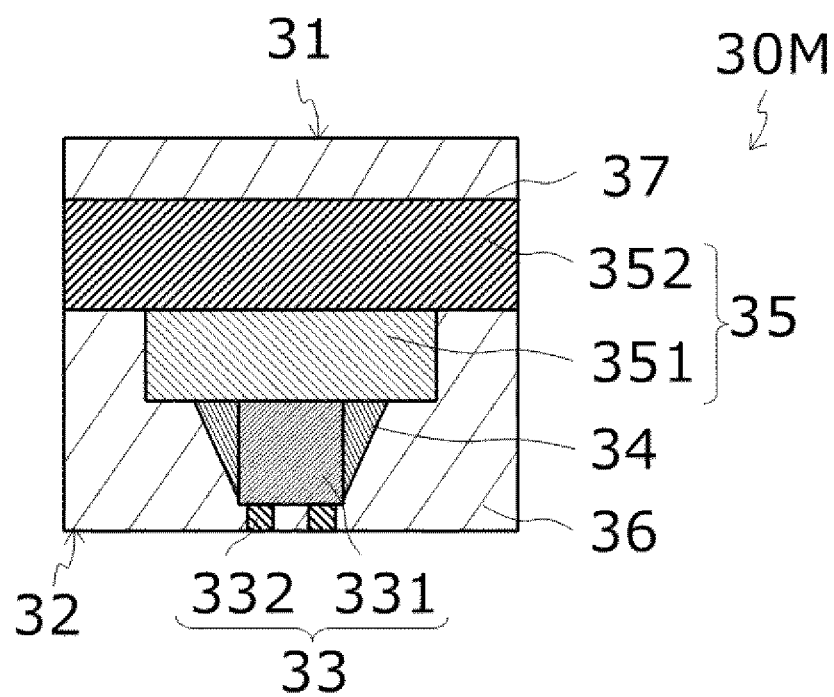
FIG. 3M is a schematic cross section view showing a modified example of the light source used with the method for manufacturing a linear light source of the first embodiment.

FIG. 3A to 3N illustrate the light source 30 that can be used in the linear light source of the first to third embodiments. Each light source 30 comprises a top surface 31, and a bottom surface 32 that is on the side opposite to the top surface 31, and that comprises a pair of electrodes 332.

A light source 30A shown in FIG. 3A is a light emitting device that comprises a light emitting element 33, and a light adjusting member 37 placed thereon. The bottom surface 32 of the light source 30A is the bottom surface of the light emitting element 33. Also, the top surface 31 of the light source 30A is the top surface of the light adjusting member 37. The side surface of the light source 30A includes the light emitting element 33 and the light adjusting member 37.

For the light emitting element 33, it is possible to use a known semiconductor light emitting element such as a light emitting diode. The composition of a semiconductor laminate 331 of the used light emitting element 33, and the light emission wavelength, size, quantity, etc., thereof can be selected as appropriate according to the purpose. For the light emitting element 33, it is possible to select a light emitting element that emits light of any wavelength from ultraviolet light to visible light. For example, as a light emitting element that emits ultraviolet, blue, or green light, it is possible to use a light emitting element that uses a nitride semiconductor ($In_XAl_YGa_{1-X-Y}N$, $0 \leq X$, $0 \leq Y$, $X+Y \leq 1$) as the semiconductor laminate 331. Also, as a light emitting element that emits red light, examples include GaAs, GaP, InP, etc. It is possible to select various light emission wavelengths according to the material of the semiconductor laminate 331 and the mixed crystal degree thereof. The shape of the semiconductor laminate 331 of the light emitting element 33 can be a quadrangle such as a square, rectangle, etc., or can be polygon such as a triangle, hexagon, etc., in the plan view. For the size of the light emitting element in the plan view, for example, the length of one side can be 50 µm to 1000 µm. Also, the height of the light emitting element 33 can be 5 µm to 300 µm, for example. As the electrodes 332 of the light emitting element 33, it is possible to use Cu, Au, Ni, etc., for example. The thickness of the electrodes 332 can be 0.5 µm to 100 µm, for example.

The light sources 30B to 30G shown in FIG. 3B to FIG. 3G are light emitting devices in which the side surface of the semiconductor laminate 331 of the light emitting element 33 is covered by a light transmissive member 35. With the light transmissive member 35, in the side of the light emitting element 33, the light transmissive member 35 configures a portion of the side surface of the light source. Using the light source with this kind of structure makes it possible to make it easier to emit light emitted from the side of the light emitting element 33 toward the side of the light source. Also, by at least a portion of the light transmissive member 35 of the light source with this kind of structure being placed inside the recess 211, it is possible to have light made incident within the base 20 from the inside surface of the recess 211.

Furthermore, with the light sources 30B to 30F, the top surface of the light emitting element 33 is also covered by the light transmissive member 35. The light transmissive member 35 of the light sources 30F, 30J includes a two layer structure of a first light transmissive member 351 and a second light transmissive member 352 placed thereon. Also, the light transmissive member 35 of the light source 30K includes a two layer structure of the second light transmissive member 352 and the first light transmissive member 351 laminated thereon. In the first light transmissive member 351 and the second light transmissive member 352, for example, the first light transmissive member 351 incudes a wavelength conversion substance, and the second light transmissive member 352 can be a layer that substantially does not contain the wavelength conversion substance. Also, the layers may contain respectively different wavelength conversion substances or the same wavelength conversion substance. It is also possible for the light transmissive member 35 to have a three layer structure. Furthermore, the light transmissive member 35 that covers the side surface of the semiconductor laminate 331 and the light transmissive member 35 that covers the top surface may be an integral unit or may be separate units. In the case of separate units, it is possible to use light transmissive members 35 of respectively the same members, or light transmissive members 35 with different types, concentration, etc., of the wavelength conversion substance.

In the light sources 30B and 30C, the bottom surface of the semiconductor laminate 331 of the light emitting element 33 and the electrodes 332 are exposed from the light transmissive member 35. In such a case, it is preferable that the thickness of the electrodes 332 of the light emitting element 33 be made thin. The thickness of the electrodes 332 can be approximately 0.5 μm to 100 μm, for example. By using such a structure, it is possible to make the thickness of the light source smaller. This makes it possible to make a thin type light emitting module.

The light sources 30H to 30N shown in FIG. 3H to 3N are light emitting devices in which a light reflective covering member 36 is placed on the side of the light emitting element 33. Using the light source with this kind of structure makes it possible to reflect downward facing light from the light emitting element 33. In other words, the loss of light from the light emitting element 33 is reduced, and it is possible to improve the efficiency of the extraction of light from the light emitting element 33.

The covering member 36 directly or indirectly covers the side surface of the semiconductor laminate 331 of the light emitting element 33. With the light sources 30H to 30M, the covering member 36 covers the side surface of the semiconductor laminate 331 of the light emitting element 33 with a light transmissive adhesive member 34 that covers the side surface of the semiconductor laminate 331 of the light emitting element 33 interposed. However, the invention is not limited to this, and as with the light source 30N, it is also possible for the covering member 36 to be in contact with the side surface of the semiconductor laminate 331 of the light emitting element 33.

With the light source 30L, the covering member 36 covers the side surface of the light transmissive member 35. Using this kind of structure makes light control possible in any direction. Also, with the light source 30M, of the light transmissive member 35, the covering member 36 covers the side surface of the first light transmissive member 351 of the lower layer side, and does not cover the side surface of the second light transmissive member 352 of the upper layer side. Using this kind of structure makes light control possible in any direction.

With the light sources 30H to 30M, the light transmissive member 35 and the light emitting element 33 are adhered using the light transmissive adhesive member 34. The light transmissive adhesive member 34 covers the side surface of the semiconductor laminate 331 of the light emitting element 33. The light transmissive adhesive member 34 may also be between the light emitting element 33 and the light transmissive member 35. Also, the light transmissive adhesive member 34 may be omitted as shown in the light source 30N. As the light transmissive adhesive member 34, it is possible to use epoxy resin, silicone resin, or a resin with these mixed, etc.

As shown in FIG. 3N, the light source 30N comprises a plurality of light emitting elements 33. Here, an example is shown comprising four light emitting elements 33 arrayed in two columns and two rows. The number of light emitting elements 33 is not limited to this. The light emitting wavelength of the light emitting elements 33 may be the same or may be different. For example, in the row at the upper side in the top view of FIG. 3N it is possible to align a red light emitting element and a green light emitting element from the left, and in the row of the lower side, to align a blue light emitting element and a red light emitting element from the left. When comprising three colors of light emitting element which are the three primary colors of light in this way, it is also possible to not comprise the wavelength conversion substance in the light transmissive member 35 placed on these.

The light sources 30D to 30N include the light reflective covering member 36 that covers the bottom surface of the semiconductor laminate 331 of the light emitting element 33 and the side surfaces of the electrodes 332. In other words, the bottom surface 32 of the light source is configured by the covering member 36, and the electrodes 332 of the light emitting element 33. This makes it possible to suppress absorption of light from the light emitting element 33 by a wiring substrate, etc.

The light sources 30E, 30F, 30G, 30I, 30J, 30K, 30M, and 30N comprise the light adjusting member 37 above the light emitting element 33. In the light source 30G, the top surface of the light emitting element 33 and the light adjusting member 37 are in contact. The top surface 31 of each of these light sources is configured by the light adjusting member 37. The light adjusting member 37 includes a light reflective member. By comprising the light adjusting member 37, it is possible to adjust the amount of light emitted upward from the light source. This makes it possible to extract light efficiently from the third surface 23 side of the base 20 which is the light emitting surface 13 of the linear light source 10.

The light source for which the bottom surface of the semiconductor laminate 331 and the side surfaces of the electrodes 332 of the light emitting element 33 are covered by the covering member 36 or the light transmissive member 35 may include a metal film such as a plating layer or sputtering film, etc., that covers the electrodes 332. For the material of the metal film, for example, it is possible to use Ag, Ni, Au, Ru, Ti, Pt, etc., in a single layer, or laminated. As the laminated structure, for example, it is possible to use a laminated structure for which Ag/Cu, Ni/Au, Ni/Ru/Au, Ti/Pt/Au, and Cu/Ni/Au are laminated in this order. The metal film may also be placed to continuously cover a portion of the covering member 36 or the light transmissive member 35 that covers the side surface of a pair of the electrodes 332, and the electrodes 332.

(Light Transmissive Member)

The light transmissive member 35 has a translucency by which at least light from the light emitting element 33 is transmitted, with 60% or more of light emitted from the light emitting element 33 being transmitted, and preferably 90% or more being transmitted. As the material of the light transmissive member 35, it is possible to use a light transmissive thermosetting resin material such as epoxy resin, silicone resin, etc.

The light transmissive member 35 may also contain a particulate phosphor as the wavelength conversion substance in the abovementioned resin material. The wavelength conversion substance includes a wavelength conversion substance of a phosphor that converts the wavelength of the light emitted from the light emitting element 33 to light of a different wavelength, etc. The light transmissive member 35 may contain a single layer or a plurality of layers for the layer that contains the wavelength conversion substance. It is also possible to include a laminated structure of layers that contain the wavelength conversion substance and layers that substantially do not contain the wavelength conversion substance.

As the phosphor, examples include yttrium aluminum garnet type phosphor (e.g. $Y_3(Al, Ga)_5O_{12}$: Ce), lutetium aluminum garnet type phosphor (e.g. $Lu_3(Al, Ga)_5O_{12}$: Ce), terbium aluminum garnet type phosphor (e.g. $Tb_3(Al, Ga)_5O_{12}$: Ce), silicate type phosphor (e.g. $(Ba, Sr)_2SiO_4$: Eu), chlorosilicate type phosphor (e.g. $Ca_8Mg(SiO_4)_4Cl_2$: Eu). Furthermore, as nitride type phosphor, examples include β sialon type phosphor (e.g. $Si_6\text{-}zAl_zO_zN_{8-z}$: Eu (0<z<4.2)), α sialon type phosphor (e.g. Mz $(Si, Al)_{12}(O, N)_{16}$ (where 0<z≤2, and M is a lanthanide element excluding Li, Mg, Ca, Y, and La and Ce), nitrogen-containing calcium aluminosilicate (CASN or SCASN) type phosphor (e.g. (Sr, Ca)$AlSiN_3$: Eu), etc. Examples include phosphors represented by general formula (I) $Ma_xMb_yAl_3N_z$: Eu (where in general formula (I), Ma is at least one type of element selected from the group comprising Ca, Sr, and Ba, Mb is at least one element selected from the group comprising Li, Na, and K, and x, y, and z respectively fulfill 0.5≤x≤1.5, 0.5≤y≤1.2, and 3.5≤z≤4.5). A further example is an SGS type phosphor (e.g. $SrGa_2S_4$: Eu). In addition to these, examples include manganese-activated fluoride type phosphor (phosphors represented by general formula (II) $A_2[M_{1-a}Mn_aF_6]$ (where in general formula (II), A is at least one type selected from the group comprising K, Li, Na, Rb, Cs, and $NH_4$, M is at least one type of element selected from the group comprising Group 4 elements and Group 14 elements, and a fulfills 0<a<0.2)). As a representative example of this manganese-activated fluoride type phosphor, there is a manganese-activated potassium fluoride silicate phosphor (e.g. KSF ($K_2SiF_6$: Mn)).

One type or a plurality of types of phosphor may be contained in one light transmissive member. The plurality of types of phosphors may be used mixed, or may be used laminated. For example, using the light emitting element 33 that emits blue light, as the phosphor, it is possible to contain a β sialon phosphor that emits green light and a fluoride type phosphor of KSF phosphor, etc., that emits red light. By using this kind of two-type phosphor, it is possible to broaden the color reproduction range of the light emitting module. The phosphor may also be quantum dots.

The phosphor may be placed in any way inside the light transmissive member 35. For example, the phosphor may be approximately evenly distributed inside the wavelength conversion member, or may be unevenly distributed in one part.

The light transmissive member 35 may contain a light diffusing substance. Examples of the light diffusing substance include fine particles of $SiO_2$, $TiO_2$, $Al_2O_3$, ZnO, etc.

(Covering Member)

The covering member 36 is a light reflective member. With the covering member 36, the reflectance with respect to light emitted from the light emitting element 33 can for example be 60% or greater, preferably 70% or greater, and more preferably 90% or greater. The material of the covering member 36 is preferably a resin material that contains a white pigment, etc. A silicone resin that contains titanium oxide is particularly preferable.

(Light Adjusting Member)

The light adjusting member 37 is a light reflective member. The light adjusting member 37 can have the reflectance or transmittance selected as appropriate to have the desired light distribution according to the strength of the light emitted from the light emitting element 33, the thickness or size of the base 20, etc. For example, the reflectance with respect to the light from the light emitting element 33 can be 70% or greater, for example, or can be 80% or greater. The material of the light adjusting member 37 is preferably a resin material that contains a white pigment, etc. The pigment may be other than white. Silicone resin that contains titanium oxide is particularly preferable. The thickness of the light adjusting member 37 can be 30 μm to 200 μm, for example, and more preferably can be 50 μm to 100 μm. It is also possible to use a dielectric film (DBR film), etc.

(Step for Placing Light Source in Recess)

Next, the light source 30 is placed inside the recess 211 of the base 20. First, a joining member 40 is placed inside the recess 211. For example, as shown in FIG. 4A, using a dispensing nozzle 80, the liquid joining member 40 is supplied inside each recess 211. The amount of the joining member 40 can be made to be the same height as the top surface of the recess 211, for example. Alternatively, it is also possible to be at a position lower than the top surface of the recess 211.

When the top surface of the light source 30 is a highly tacky member, it is possible to omit the step of placing the joining member inside the recess. Alternatively, in a case when comprising the joining member in advance at the side of the light source 30, it is possible to omit the step for placing the joining member 40 inside the recess 211.

As the material of the joining member 40, it is possible to use a light transmissive, thermosetting resin material, etc., such as epoxy resin, silicone resin, etc.

Next, the light source 30 is placed as shown in FIG. 4B. In specific detail, the top surface of the light source 30 is faced toward the recess 211 side (lower side), and the light source 30 is placed inside the recess 211. Here, because a case of using the joining member 40 is illustrated, the top surface of the light source 30 is placed facing the bottom surface of the recess 211 with the joining member 40 interposed. With the light source 30, the bottom surface (electrode surface) 32 is suctioned by a suction nozzle 90 and transferred. Alternatively, it is also possible to hold a plurality of the light sources 30 using an adhesive sheet, etc., and to place the plurality of light sources 30 all at once.

The light source 30 is placed before the joining member 40 is hardened. This makes it possible to do placement with the joining member 40 pushed away so that the top surface 31 of the light source 30 is placed at a position near the bottom surface of the recess 211. The joining member 40 crawls up the side surface of the light source 30 to cover the side surface of the light source 30. A portion of the joining member 40 may also extend above the planar section 212 from the recess 211.

(Step for Placing First Reflective Member)

Figure 4C:
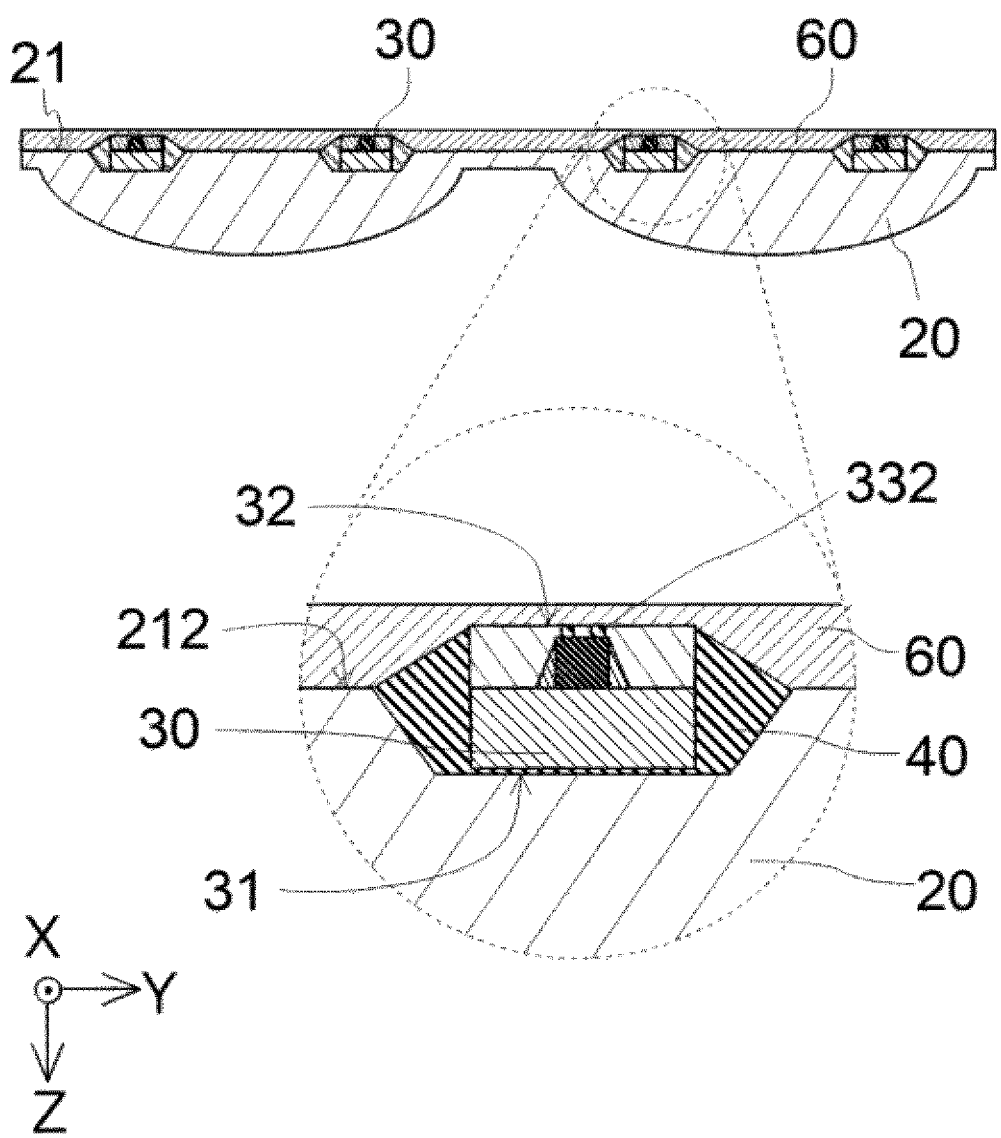
FIG. 4C is a schematic cross section view showing an example of a manufacturing step of the linear light source of the first embodiment.

Next, the first reflective member 60 is placed. First, as shown in FIG. 4C, the first reflective member 60 is placed so as to cover the light source 30 and the first surface 21 of the base 20. The first reflective member 60 is placed to also cover the linking part 24 of the base 20.

The first reflective member 60 can be placed by being formed using a method such as printing, spraying, or compression molding. At this stage, the bottom surface (electrode surface) 32 of the light source 30 is covered by the first reflective member 60. In other words, the electrodes 332 of the light source 30 are not exposed to the outside.

Next, as shown in FIG. 4D, a portion of the first reflective member 60 is ground, exposing the electrodes 332 of the light source 30. As the grinding method, it is possible to use a method of grinding the first reflective member 60 to a planar form using a grinding member such as a whetstone, etc., or a method that shaves the first reflective member 60 by blasting. When forming the first reflective member 60, when forming so as not to bury the electrodes 332, it is possible to omit this kind of shaving step of the first reflective member 60.

The first reflective member 60 is preferably a member that can reflect light from the light emitting element 33. For example, it is possible to use a resin material containing a light reflective substance, or a metal material, a dielectric film, etc.

When using a resin material as the material of the first reflective member 60, it is preferable to use as a base material a resin material that has as a main component a thermosetting resin such as a silicone resin, a silicone modified resin, an epoxy resin, a phenol resin, etc. As the light reflective substance contained in the resin material, for example, it is possible to use a white substance. In specific terms, for example, titanium oxide, silicon oxide, zirconium oxide, potassium titanate, aluminum oxide, aluminum nitride, boron nitride, mullite, etc., are suitable. The light reflective substance can be used in particle form, fiber form, thin sheet form, etc.

When using a metal material as the material of the first reflective member 60, examples include Ag, Al, Cu, Ni, Au, etc. These may have a single layer structure, a laminated structure, or be a composite material.

When using a dielectric film as the material of the first reflective member 60, examples include a laminated film of $SiO_2$, $TiO_2$, $ZrO$, $Al_2O_5$, $Nb_2O_5$, $Ta_2O_5$, etc.

With the first reflective member 60, the reflectance with respect to the light from the light emitting element 33 is preferably 70% or greater, more preferably 80% or greater, and even more preferably 90% or greater.

Next, as shown in FIG. 4E, an electrically conductive member 70 is formed on the electrodes 332 of the light source 30 and the first reflective member 60. Here, an example is shown of forming to cover approximately the entire surfaces of the electrodes 332 and the first reflective member 60. It is preferable that the electrically conductive member 70 be formed to be continuous with the electrodes 332 of the plurality of light sources 30. As the material of the electrically conductive member 70, examples include metal materials such as Cu, Ni, Au, Ag, etc. These may have a single layer structure or a laminated structure. As the laminated structure, examples include a laminated structure with lamination in the order of Cu/Ni/Au from the first reflective member 60 side. As the method of forming the electrically conductive member 70, examples include sputtering, plating, printing, etc. As the film thickness of the electrically conductive member 70, examples include 0.03 µm to 100 µm. In particular, when forming using sputtering, it is preferably 0.03 µm to 0.08 µm.

Next, as shown in FIG. 4F, the electrically conductive member 70 is partially removed. As a method for removing the electrically conductive member 70, examples include laser beam irradiation, etching, grinding, etc.

Also, when forming the electrically conductive members 70, it is possible to not form on the entire surface of the first reflective member 60 and the light source 30, but rather to form the electrically conductive members 70 only on the necessary locations in advance. For example, using a mask, etc., it is possible to form the electrically conductive member 70 only on the necessary locations. In that case, it is possible to omit the step for removing the electrically conductive member 70.

The step for forming the electrically conductive member 70 may also be performed after the step for forming the second reflective member described later.

Figure 4G:
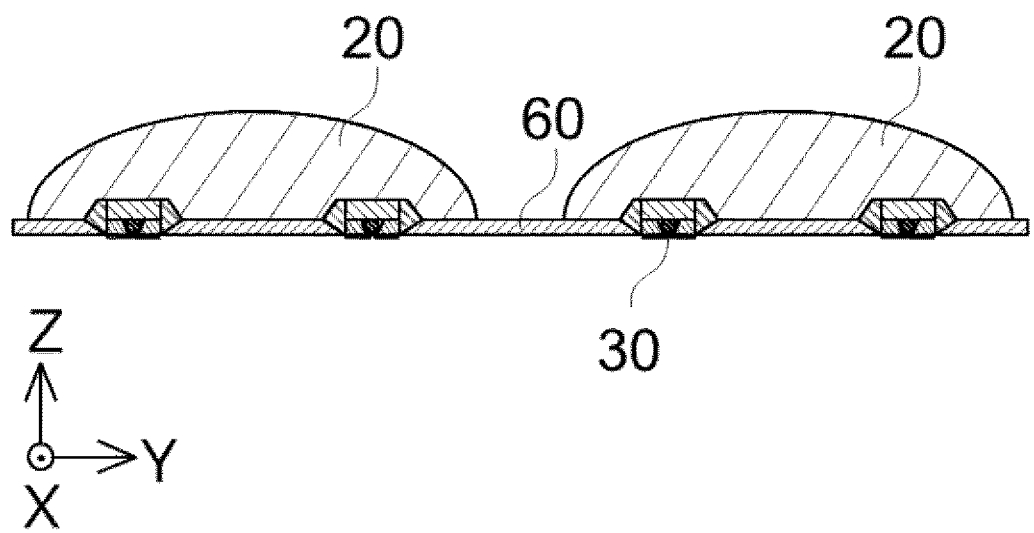
FIG. 4G is a schematic cross section view showing an example of a manufacturing step of the linear light source of the first embodiment.

Next, as shown in FIG. 4G, the linking part 24 of the base 20 is removed. When using the base 20 that does not comprise the linking part 24, it is possible to omit this step. As the method for removing the linking part 24, examples include laser beam irradiation, cutting using cutting teeth, etc. When removing the linking part 24, a part or all of the first reflective member 60 may be removed. Though not illustrated, the bases 20 may be linked to a frame, etc., for supporting them. In other words, though the two bases 20 are completely separated in the end surface view shown in FIG. 4G, the two bases 20 may be linked using parts other than that, for example, a frame part placed on an extension in the X direction.

(Step for Placing Second Reflective Member)

Figure 4H:
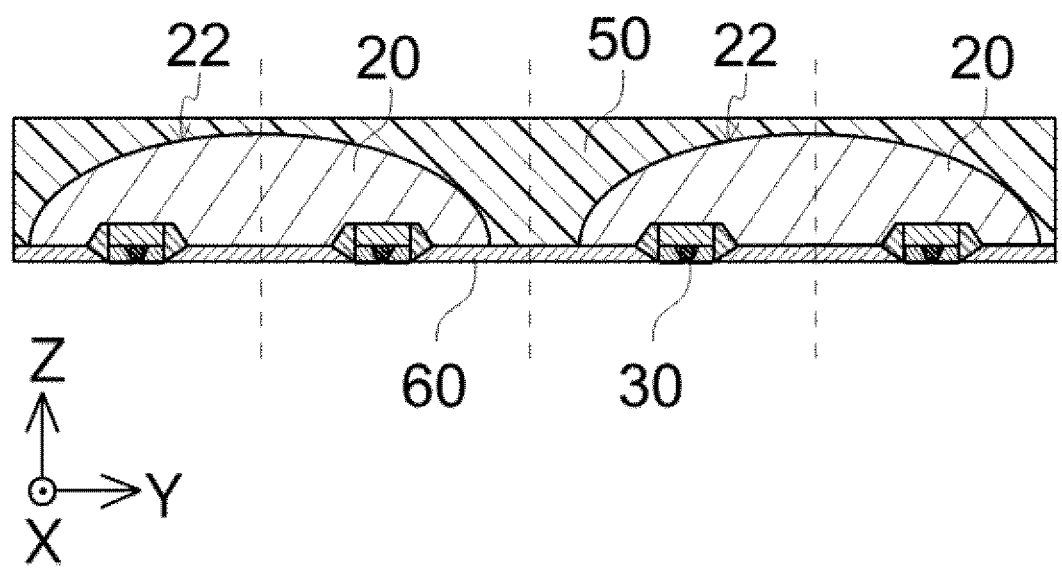
FIG. 4H is a schematic cross section view showing an example of a manufacturing step of the linear light source of the first embodiment.
Figure 4I:
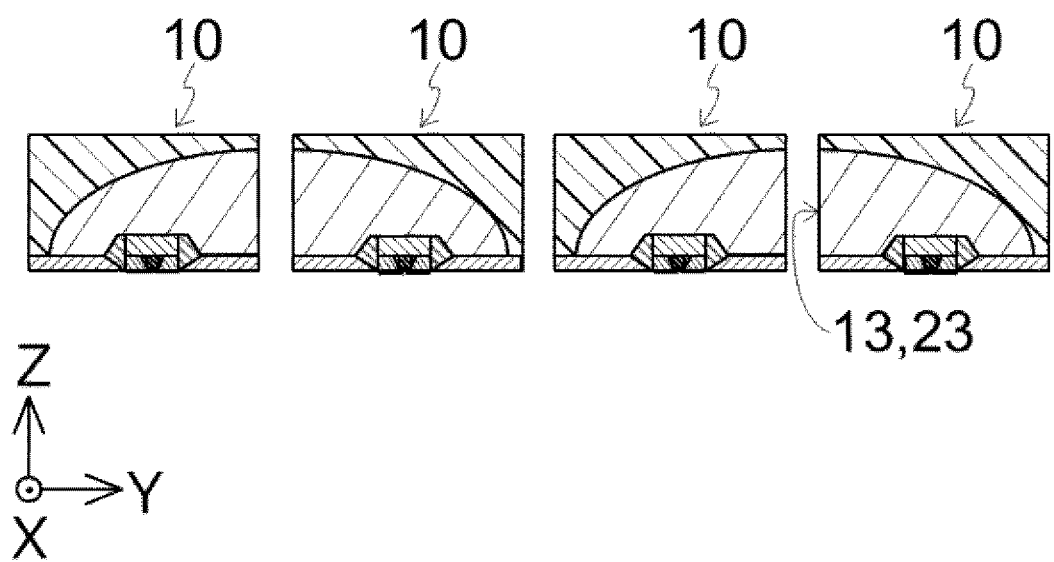
FIG. 4I is a schematic cross section view showing an example of a manufacturing step of the linear light source of the first embodiment.

Next, the second reflective member 50 is placed as shown in FIG. 4H. In specific detail, this is placed to cover the entire surface of the second surface 22 of the base 20. The top surface of the second reflective member 50 can be a flat surface to be parallel to the first surface 21 of the base 20. Alternatively, the top surface of the second reflective member 50 can be a flat surface to be parallel to the bottom surface of the first reflective member 60.

As the material of the second reflective member 50, it is possible to use the same material as those listed as the materials of the first reflective member 60. Among these materials, for the second reflective member 50, it is possible to select the same material as that of the first reflective member 60, or to use a different material. As shown in FIG. 4H, in the cross section orthogonal to the first direction, when the top surface of the second reflective member 50 is a flat surface, the thickness of the second reflective member 50 is different above the second surface 22 of the base 20. For that reason, as the material of the second reflective member 50, it is preferable to use a resin material.

When using a metal material or a dielectric film as the second reflective member 50, a curved second reflective member that follows the shape of the second surface 22 of the base 20 is formed. In that case, a protective member of resin material, etc., is further formed to cover the second reflective member, and it is possible to have the top surface of the protective member be a flat surface. In such a case, as the protective member, it is possible to use a light reflective resin material, a light transmissive resin material, a light absorbing resin material, etc.

Next, the base 20 is cut, and the third surface 23 of the base 20 is formed. In specific detail, in a position that is the center of one base 20, sandwiching two recesses 211, the base 20 is cut along the first direction. Simultaneously, the first reflective member 60 and the second reflective member 50 that sandwich the base 20 above and below are also cut. By doing this, the third surface 23 of the base 20 is formed with the first reflective member, the second reflective member and the base are exposed at the third surface, and the front surface (light extraction surface) of the linear light source is formed.

Also, when the plurality of bases 20 are covered by one second reflective member 50, the second reflective member 50 is cut between the bases 20. At this time, when there is the first reflective member 60 between the bases 20, the first reflective member 60 is cut at the same time. By doing this, a back surface 12 of the linear light source 10 is formed.

By doing as described above, it is possible to obtain the linear light source 10 shown in FIG. 1A, etc.

Second Embodiment

FIG. 5 is a drawing showing an example of the linear light source obtained with the method for manufacturing a linear light source of the embodiment. Compared to with the first embodiment in which the light source comprises the light emitting element and a member that covers the light emitting element, with the second embodiment, the point of difference from the first embodiment is that the light source is only the light emitting element. In other words, the light source 30 of a linear light source 10A is the same as the light emitting element 33.

Furthermore, with the second embodiment, the point of difference is that a wavelength conversion member 100 is placed inside the recess 211, and a joining member 41 is placed on that wavelength conversion member 100. In other words, the top surface of the light source 30 (33) faces the bottom surface of the recess 211 with the wavelength conversion member 100 and the joining member 40 interposed.

In FIG. 6A to FIG. 6D, mainly the difference points from the first embodiment in the method for manufacturing a linear light source of the second embodiment are explained.
(Step for Preparing Base)

The step for preparing the base is the same as with the first embodiment.
(Step for Preparing Light Source)

In the second embodiment, the light source 30 is configured only by the light emitting element 33. As the light emitting element, it is possible to use the same items as the light emitting element 33 used for the light source 30A of the first embodiment.
(Step for Placing Light Source Inside Recess)

With the second embodiment, the wavelength conversion member 100 is placed inside the recess 211. The wavelength conversion member 100 includes a light transmissive base material, and a wavelength conversion substance such as phosphor, etc. As the material of the base material, for example, it is possible to use epoxy resin, silicone resin, a resin with these mixed, or a light transmissive material such as glass, etc. As the wavelength conversion substance, examples include a YAG phosphor, a β sialon phosphor, or a fluoride type phosphor such as a KSF type phosphor, a nitride type phosphor such as a CASN type phosphor, a SCASN type phosphor, etc. The wavelength conversion substance may also be quantum dots. It is possible to use one type or two or more types of the wavelength conversion substance. Also, the wavelength conversion member 100 may have a structure for which a plurality of layers each containing the wavelength conversion substance are laminated. Furthermore, the wavelength conversion member 100 may have a structure in which layers containing the wavelength conversion substance and layers that do not contain the wavelength conversion substance are laminated. The light transmissive member 35 may also contain fine particles of $SiO_2$, $TiO_2$, etc.

Figure 6A:
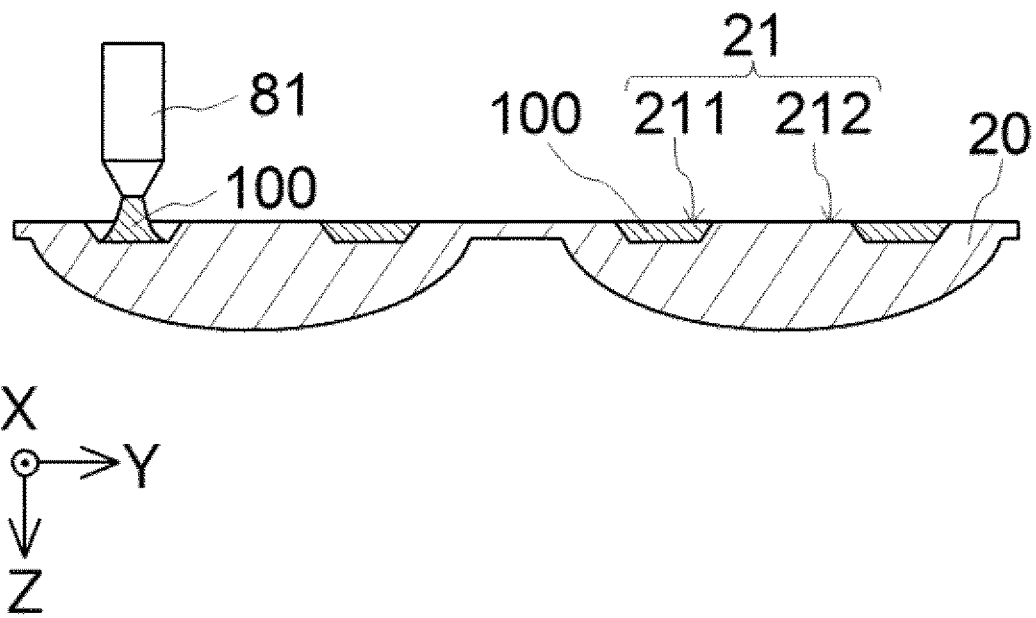
FIG. 6A is a schematic cross section view showing an example of a manufacturing step of the linear light source of the second embodiment.

As the method for placing the wavelength conversion member 100, examples include a method of placing the liquid wavelength conversion member 100 inside the recess 211 using a dispensing nozzle 81 like that shown in FIG. 6A. Alternatively, it is possible to mount a mask having openings at the parts corresponding to the recesses 211 on the first surface 21 of the base 20, and to place the wavelength conversion member 100 inside the recesses 211 by printing using a squeegee.

For the wavelength conversion member 100, it is also possible to use a hardened product molded in advance. For example, it is possible to use an item for which the wavelength conversion member molded in sheet form is cut into small pieces of a size that can be placed inside the recess 211. Alternatively, it is possible to use the wavelength conversion member 100 molded in advance to a size that can be placed in the recess 211.

With the example shown in FIG. 6A, the wavelength conversion member 100 is the same height as the planar section 212 of the periphery of the recess 211. However, the invention is not limited to this, and this may also be placed to extend on the planar section 212 from the recess 211.

After the wavelength conversion member 100 is hardened using heat, etc., the joining member 41 is placed on the wavelength conversion member 100. For the joining member 41, it is possible to use the same material as the joining member 40 used with the first embodiment.

Figure 6B:
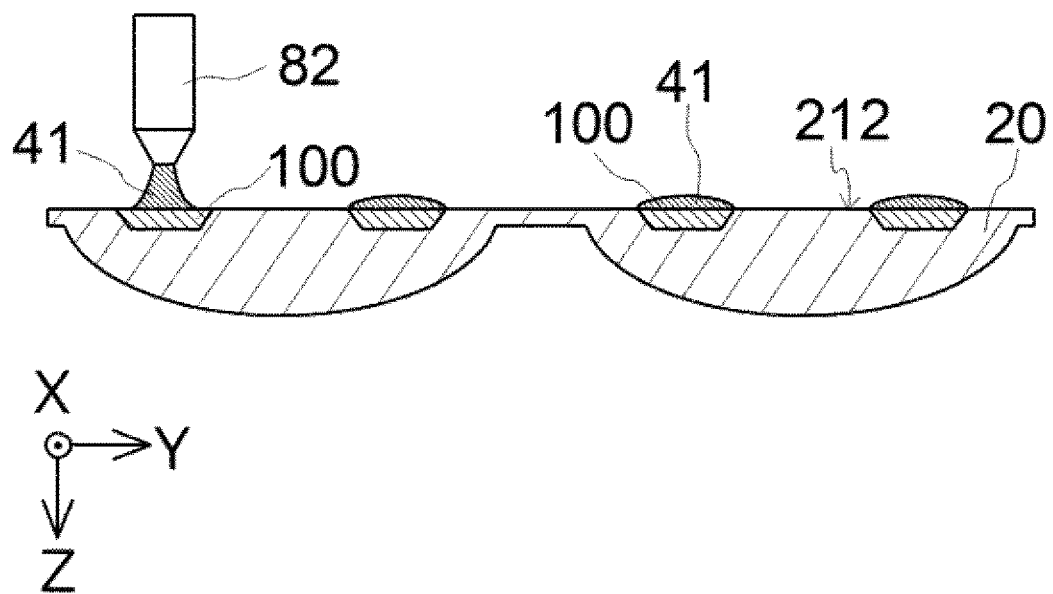
FIG. 6B is a schematic cross section view showing an example of a manufacturing step of the linear light source of the second embodiment.

The joining member 41 can be placed to cover a part or all of the wavelength conversion member 100. As the method for placing the joining member 41, an example is a method of placing the liquid joining member 41 on the wavelength conversion member 100 using a dispensing nozzle 82 as shown in FIG. 6B.

Next, the light source 33 is placed as shown in FIG. 6C. In specific detail, the top surface of the light source 33 faces the recess 211 side, and the light source 33 is placed on the joining member 41 on the wavelength conversion member 100. The light source 33 has the bottom surface (electrode surface) suctioned by a suction nozzle 91 to be transferred. Alternatively, it is also possible to hold a plurality of the light sources 33 using an adhesive sheet, etc., and to place the plurality of light sources 33 all at once.

The light source 33 is placed before the joining member 41 is hardened. This makes it possible to push away the joining member 41 for placement so as to place the top surface of the light source 33 at a position near the wavelength conversion member 100. The joining member 41 crawls up the side surface of the light source 33 to cover the side surface of the light source 33. The joining member 41 can cover 5% or more of the side surface of the light source 33, for example. However, the joining member 41 may also be an item that does not cover the side surface of the light source 33.
(Step for Placing First Reflective Member, Electrically Conductive Member, and Second Reflective Member)

The step for placing the first reflective member 60 can be performed in the same manner as with the first embodiment. Similarly, the step for forming the electrically conductive members 70 and the step for placing the second reflective member can be performed in the same manner as the first embodiment. Finally, as shown in FIG. 6D, the base 20, the first reflective member 60, and the second reflective member 50 are cut at the center of the second surface 22 of the base 20. Similarly, the first reflective member 60 and the second reflective member 50 are cut between the two bases 20. This makes it possible to obtain the linear light source 10A.

Third Embodiment

Figure 7:
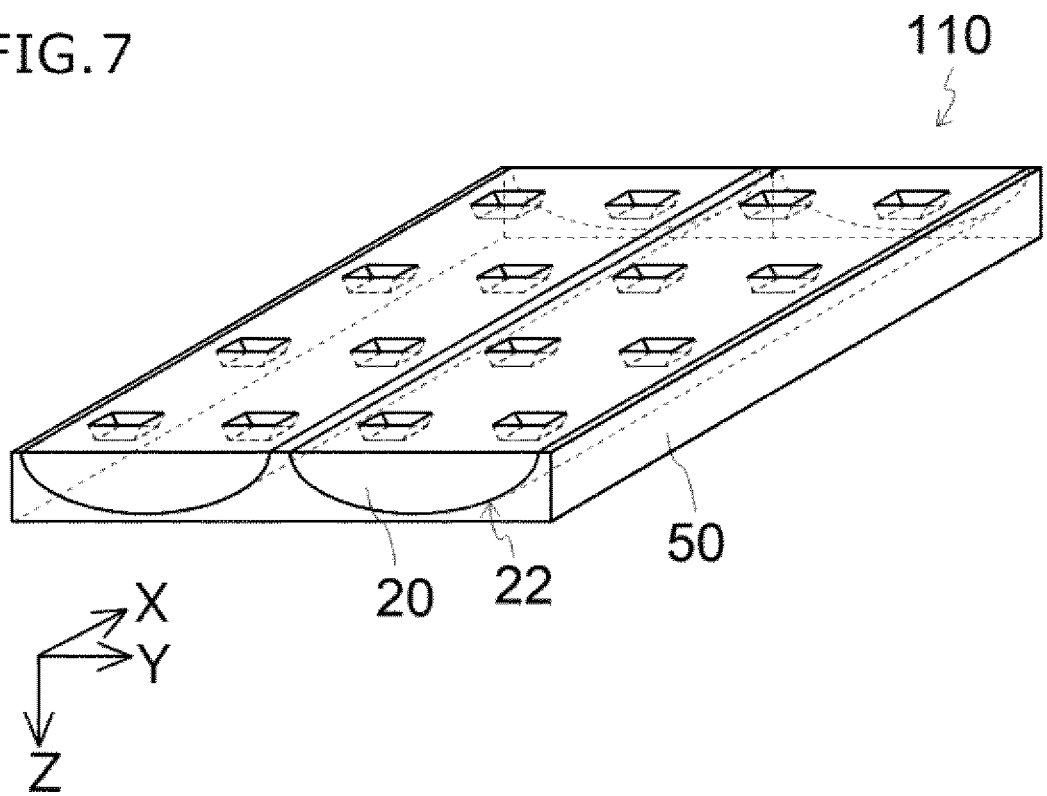
FIG. 7 is a schematic perspective view showing an example of an optical member used in the method for manufacturing a linear light source of a third embodiment.

With the third embodiment, instead of the step for preparing the base in the first embodiment or the second embodiment, comprised is a step for preparing an optical member 110 in which the second reflective member 50 is placed in advance at the second surface 22 side of the base 20, like that shown in FIG. 7. With the step for preparing the optical member 110, for example, it is possible to prepare the base 20, and to prepare via the step of forming the reflective member (second reflective member 50) that covers the second surface 22 of the base 20. Alternatively, it is also possible to prepare by purchasing the optical member 110 that comprises the base 20 and the reflective member (second reflective member 50) in advance. The other steps can be performed in the same manner as the first embodiment or the second embodiment.

Figure 8B:
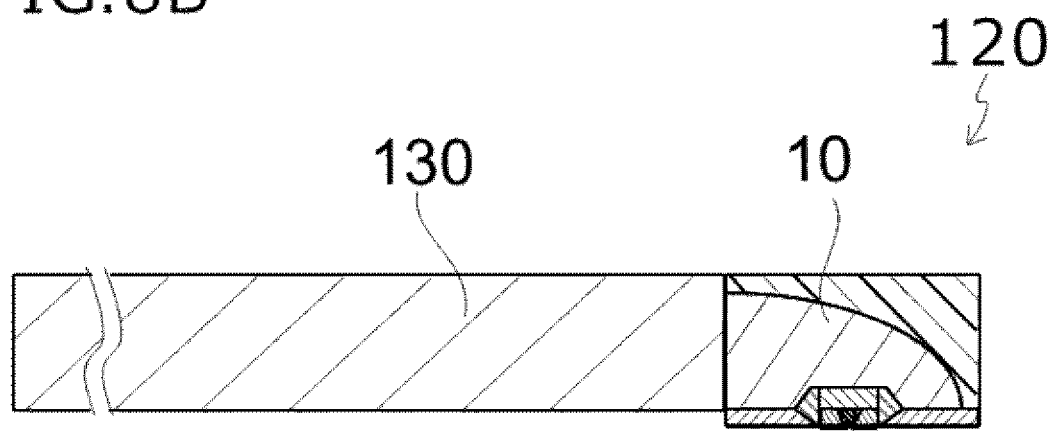
FIG. 8B is a schematic cross section view of line VIIIB-VIIIB in FIG. 8A.

FIGS. 8A and 8B illustrate an example of a planar light source 120 in which the linear light source 10 obtained with the first embodiment is placed on the end surface of a light guide plate 130. FIG. 8A is a schematic plan view of the planar light source, and FIG. 8B is a schematic cross section view of line VIIIB-VIIIB in FIG. 8A. The linear light source 10 can be joined with a wiring board such as a TFT board, etc., having a TFT (Thin-Film Transistor). Although the linear light source 10 of the first embodiment is used as an example, any of the linear light sources according to the embodiments described above can be used in the planar light source 120.

(Light Guide Plate)

The light guide plate 130 is a planar light transmissive member that performs light emission with light made incident from the light emitting element. As the material of the light guide plate 130, it is possible to use a resin material such as a thermoplastic resin such as acrylic, polycarbonate, cyclic polyolefin, polyethylene terephthalate, polyester, etc., a thermosetting resin such a epoxy, silicone, etc., or an optically transparent material such as glass, etc. In particular, the thermoplastic resin material is preferable because it can be manufactured efficiently using injection molding. Among these, polycarbonate is preferable because it has high transparency and is inexpensive.

The linear light source of the present disclosure can be used as the backlight of a liquid crystal display device, for example.

EXPLANATION OF CODES

10, 10A: Linear light source; 11: Bottom surface; 12: Back surface; 13: Front surface (light emitting surface); 14: Top surface; 15: Side surface; 20, 20A, 20B: Base; 21, 21A, 21B: First surface (light incident surface); 211, 211A, 211B: Recess; 212: Planar section; 22: Second surface (light reflecting surface); 23: Third surface (light emitting surface); 24: Linking part; 30 (30A, 30B, 30C, 30D, 30E, 30F, 30G, 30H, 30I, 30J, 30K, 30L, 30M, 30N): Light source; 31: Top surface of light source; 32: Bottom surface of light source (electrode surface); 33: Light emitting element (light source); 331: Semiconductor laminate; 332: Electrode; 34: Light transmissive adhesive member; 35: Light transmissive member; 351: First light transmissive member; 352: Second light transmissive member; 36: Covering member; 37: Light adjusting member; 40, 41: Joining member; 50: Second reflective member; 60: First reflective member; 70: Electrically conductive member; 80, 81, 82: Dispensing nozzle; 90, 91: Suction nozzle; 100: Wavelength conversion member; 110: Optical member; 120: Planar light source; and 130: Light guide plate.

What is claimed is:

1. A method for manufacturing a linear light source comprising:
    providing a base having a first surface defining a plurality of first recesses arranged in a first array extending in a first direction, and a second surface positioned on a side of the base opposite to the first surface, the second surface including a first portion having a curved contour in a cross section orthogonal to the first direction and a straight contour in a cross section parallel to the first direction;
    providing a plurality of light sources each having a top surface and a bottom surface opposite to the top surface, the bottom surface including bottom surfaces of a pair of electrodes;
    placing a wavelength conversion member in each of the first recesses;
    after the placing of the wavelength conversion member, placing each of the light sources at a position overlapping a corresponding one of the first recesses in a plan view with the top surface of each of the light sources facing a bottom surface of the corresponding one of the first recesses;
    placing a first reflective member to cover the light sources and the first surface of the base so that the electrodes of the light sources are exposed from the first reflective member;
    placing a second reflective member on the second surface of the base; and
    cutting the base along the first direction to define a third surface of the base continuous with the first surface and the second surface.

2. The method for manufacturing a linear light source according to claim 1, wherein
    the providing of the base includes providing the base having
        the first surface defining a plurality of second recesses arranged in a second array extending in the first direction,
        a second portion of the second surface having a curved contour in the cross section orthogonal to the first direction and a straight contour in the cross section parallel to the first direction, and
        a linking part extending between the first portion of the second surface and the second portion of the second surface.

3. The method for manufacturing a linear light source according to claim 1, wherein
    the providing of the light sources includes providing the light sources each including a light emitting element and a light transmissive member.

4. The method for manufacturing a linear light source according to claim 1, wherein
    the providing of the light sources includes providing the light sources each including a light emitting element.

5. The method for manufacturing a linear light source according to claim 1, wherein
    the cutting of the base includes cutting the base, the first reflective member and the second reflective member so that the base, the first reflective member and the second reflective member are exposed at the third surface.

6. The method for manufacturing a linear light source according to claim 1, further comprising
forming electrically conductive members on the first reflective member, the electrically conductive members being connected to the electrodes of the light sources.

7. The method for manufacturing a linear light source according to claim 1, wherein
the providing of the light sources includes providing the light sources each including a plurality of light emitting elements.

8. A method for manufacturing a linear light source comprising:
providing an optical member including
a base having a first surface defining a plurality of first recesses arranged in a first array extending in a first direction, and a second surface positioned on a side of the base opposite to the first surface, the second surface including a first portion having a curved contour in a cross section orthogonal to the first direction and a straight contour in a cross section parallel to the first direction, and
a reflective member covering the second surface;
providing a plurality of light sources each having a top surface and a bottom surface opposite to the top surface, the bottom surface including bottom surfaces of a pair of electrodes;
placing a wavelength conversion member in each of the first recesses;
after the placing of the wavelength conversion member, placing each of the light sources at a position overlapping a corresponding one of the first recesses of the base in a plan view with the top surface of each of the light sources facing a bottom surface of the corresponding one of the first recesses;
placing a first reflective member to cover the light sources and the first surface of the base so that the electrodes of the light sources are exposed from the first reflective member; and
cutting the optical member along the first direction to define a third surface of the base continuous with the first surface and the second surface.

9. The method for manufacturing a linear light source according to claim 8, wherein
the providing of the base includes providing the base having
the first surface defining a plurality of second recesses arranged in a second array extending in the first direction,
a second portion of the second surface having a curved contour in the cross section orthogonal to the first direction and a straight contour in the cross section parallel to the first direction, and
a linking part extending between the first portion of the second surface and the second portion of the second surface.

10. The method for manufacturing a linear light source according to claim 8, wherein
the providing of the light sources includes providing the light sources each including a light emitting element and a light transmissive member.

11. The method for manufacturing a linear light source according to claim 8, wherein
the providing of the light sources includes providing the light sources each including a light emitting element.

12. The method for manufacturing a linear light source according to claim 8, wherein
the cutting of the optical member includes cutting the optical member and the first reflective member so that the base, the reflective member and the first reflective member are exposed at the third surface.

13. The method for manufacturing a linear light source according to claim 8, further comprising
forming electrically conductive members on the first reflective member, the electrically conductive members being connected to the electrodes of the light sources.

14. The method for manufacturing a linear light source according to claim 8, wherein
the providing of the light sources includes providing the light sources each including a plurality of light emitting elements.

* * * * *